(12) United States Patent
Shiomi

(10) Patent No.: US 9,978,840 B2
(45) Date of Patent: May 22, 2018

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventor: Hiromu Shiomi, Tsukuba (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days. days.

(21) Appl. No.: 15/322,868

(22) PCT Filed: Jun. 30, 2015

(86) PCT No.: PCT/JP2015/068806
§ 371 (c)(1),
(2) Date: Dec. 29, 2016

(87) PCT Pub. No.: WO2016/002769
PCT Pub. Date: Jan. 7, 2016

(65) Prior Publication Data
US 2017/0133466 A1    May 11, 2017

(30) Foreign Application Priority Data
Jun. 30, 2014    (JP) .................................. 2014-134899

(51) Int. Cl.
*H01L 29/10*    (2006.01)
*H01L 29/16*    (2006.01)
(Continued)

(52) U.S. Cl.
CPC ...... *H01L 29/1095* (2013.01); *H01L 29/0607* (2013.01); *H01L 29/1608* (2013.01); *H01L 29/66068* (2013.01); *H01L 29/7813* (2013.01)

(58) Field of Classification Search
CPC ................. H01L 29/063; H01L 21/046; H01L 29/66068; H01L 29/1095; H01L 29/7813
See application file for complete search history.

(56) References Cited

U.S. PATENT DOCUMENTS

| | | | |
|---|---|---|---|
| 2004/0012050 | A1 | 1/2004 | Uno et al. |
| 2006/0043495 | A1 | 3/2006 | Uno et al. |

(Continued)

FOREIGN PATENT DOCUMENTS

| | | |
|---|---|---|
| JP | 2004-055803 A | 2/2004 |
| JP | 2008-147232 A | 6/2008 |

(Continued)

OTHER PUBLICATIONS

Nakano et al., "690V, 1.00 mΩcm² 4H—SiC Double-Trench MOSFETs," Materials Science Forum, vols. 717-720 (2012), pp. 1069-1072.

(Continued)

*Primary Examiner* — Roy Potter
*Assistant Examiner* — Paul Patton
(74) *Attorney, Agent, or Firm* — Venable LLP; Michael A. Sartori; Kerri M. Patterson

(57) ABSTRACT

In a first main surface of a silicon carbide substrate, a second trench having a second side surface which connects to the first main surface and is in contact with a third impurity region and a second impurity region and a second bottom portion continuous to the second side surface is formed. A fourth impurity region has a first region arranged between a second main surface and the second impurity region and a second region connecting the second bottom portion of the second trench and the first region to each other. A first electrode is electrically connected to the third impurity region on a side of the first main surface and is in contact with the second region at the second bottom portion of the second trench.

12 Claims, 15 Drawing Sheets

(51) Int. Cl.
    *H01L 29/78*     (2006.01)
    *H01L 29/06*     (2006.01)
    *H01L 29/66*     (2006.01)

(56) References Cited

U.S. PATENT DOCUMENTS

2008/0048256 A1    2/2008  Uno et al.
2008/0057650 A1    3/2008  Uno et al.
2012/0037920 A1*  2/2012  Treu .................... H01L 29/1608
                                                                 257/77

FOREIGN PATENT DOCUMENTS

JP          2012-044167 A      3/2012
JP          2012-069797 A  *  4/2012  ........... H01L 29/739

OTHER PUBLICATIONS

International Search Report in counterpart International Application No. PCT/JP2015/068806, dated Sep. 8, 2015.

\* cited by examiner

SILICON CARBIDE SEMICONDUCTOR DEVICE AND METHOD FOR MANUFACTURING THE SAME

TECHNICAL FIELD

The present invention relates to a silicon carbide semiconductor device and a method for manufacturing the same, and particularly to a silicon carbide semiconductor device having a trench provided in a main surface and a method for manufacturing the same.

BACKGROUND ART

In order to allow a semiconductor device to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage and a lower on-resistance of a semiconductor device can be achieved. A semiconductor device in which silicon carbide has been adopted as a material is also advantageous in that lowering in characteristics during use in a high-temperature environment is less than in a semiconductor device in which silicon has been adopted as a material.

For example, Japanese Patent Laying-Open No. 2008-147232 (PTD 1) describes a trench metal oxide semiconductor field effect transistor (MOSFET) composed of silicon carbide. According to the MOSFET, a thickness of a channel layer is set to at least a thickness calculated in a prescribed calculation formula so as not to cause punch through due to a short channel effect, and a lower end of a base layer is provided on a side of a drain electrode relative to a lower end of a gate trench.

Y. Nakano et al., "690V, 1.00 mΩcm² 4H-SiC Double-Trench MOSFETs," Materials Science Forum Vols. 717-720 (2012) page 1069-1072 (NPD 1) describes a MOSFET in which a trench for holding a breakdown voltage is fabricated adjacently to a trench for switching and a bottom portion of the trench for holding a breakdown voltage is provided on a side of a drain electrode relative to a bottom portion of the trench for switching. A p-type base layer is provided under the trench for holding a breakdown voltage.

CITATION LIST

Patent Document

PTD 1: Japanese Patent Laying-Open No. 2008-147232

Non Patent Document

NPD 1: Y. Nakano et al., "690V, 1.00 mΩcm² 4H-SiC Double-Trench MOSFETs," Materials Science Forum Vols. 717-720 (2012) page 1069-1072

SUMMARY OF INVENTION

Technical Problem

In the MOSFET described in Japanese Patent Laying-Open No. 2008-147232, a semiconductor portion which forms the channel is provided above a p-type base layer, so that application of high electric field to a bottom portion of a trench by a depletion layer which extends under the p-type base layer is prevented. A source electrode, however, is located at a distance from the p-type base region. Therefore, a resistance is high between the source electrode and the p-type base region and it is difficult to fix a potential of the p-type base region in a stable manner. Consequently, it has been unable to obtain a semiconductor device sufficiently fast in response.

In the MOSFET described in Y. Nakano et al., "690V, 1.00 mΩcm² 4H-SiC Double-Trench MOSFETs," Materials Science Forum Vols. 717-720 (2012) page 1069-1072, in order to fabricate the structure above, a trench for forming the channel is protected by fabricating a trench for holding a breakdown voltage adjacently to a trench for forming the channel, providing a p-type base layer under the trench for holding a breakdown voltage, and forming a depletion layer at a position deeper than a bottom portion of the trench for forming the channel. In the structure, however, high electric field is applied to a semiconductor layer forming the channel and it has been unable to achieve high reliability.

An object of one manner of the present invention is to provide a silicon carbide semiconductor device fast in response and high in reliability and a method for manufacturing the same.

Solution to Problem

A silicon carbide semiconductor device according to one manner of the present invention includes a silicon carbide substrate, a gate insulating film, a gate electrode, a first electrode, and a second electrode. The silicon carbide substrate has a first main surface and a second main surface opposite to the first main surface. The silicon carbide substrate includes a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region. In the first main surface of the silicon carbide substrate, a first trench having a first side surface and a first bottom portion is formed, the first side surface continuous to the first main surface and being in contact with the third impurity region, the second impurity region, and the first impurity region, the first bottom portion continuous to the first side surface, and in the first main surface, a second trench having a second side surface and a second bottom portion is formed, the second side surface continuous to the first main surface and being in contact with the third impurity region and the second impurity region, the second bottom portion continuous to the second side surface. The fourth impurity region has a first region arranged between the second main surface and the second impurity region and a second region connecting the second bottom portion of the second trench and the first region to each other. The gate insulating film is in contact with the first impurity region, the second impurity region, and the third impurity region at the first side surface of the first trench. The gate electrode is provided on the gate insulating film. The first electrode is electrically connected to the third impurity region on a side of the first main surface and is in contact with the second region at the second bottom portion of the second trench. The second electrode is electrically connected to the first impurity region on the side of the second main surface. The fourth impurity region is electrically connected to the first electrode.

A method for manufacturing a silicon carbide semiconductor device according to one manner of the present invention includes steps below. A silicon carbide substrate having a first main surface and a second main surface opposite to the first main surface is prepared. The silicon carbide substrate includes a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region. In the first main surface of the silicon carbide substrate, a first trench having a first side surface and a first bottom portion is formed, the first side surface continuous to the first main surface and being in contact with the third impurity region, the second impurity region, and the first impurity region, the first bottom portion continuous to the first side surface, and in the first main surface, a second trench having a second side surface and a second bottom portion is formed, the second side surface continuous to the first main surface and being in contact with the third impurity region and the second impurity region, the second bottom portion continuous to the second side surface. The fourth impurity region has a first region arranged between the second main surface and the second impurity region and a second region connecting the second bottom portion of the second trench and the first region to each other. A gate insulating film in contact with the first impurity region, the second impurity region, and the third impurity region at the first side surface of the first trench is formed. A gate electrode is formed on the gate insulating film. A first electrode electrically connected to the third impurity region on a side of the first main surface and being in contact with the second region at the second bottom portion of the second trench is formed. A second electrode electrically connected to the first impurity region on a side of the second main surface is formed. The fourth impurity region is electrically connected to the first electrode.

Advantageous Effects of Invention

According to one manner of the present invention, a silicon carbide semiconductor device fast in response and high in reliability and a method for manufacturing the same can be provided.

DESCRIPTION OF EMBODIMENTS

Figure 1:
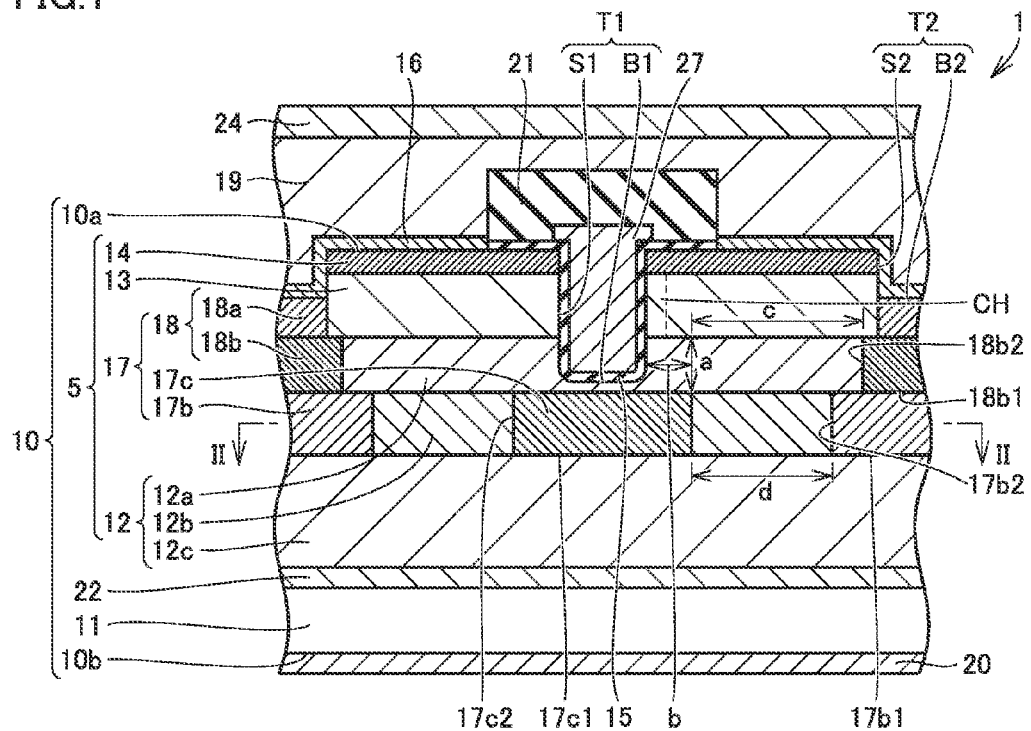
FIG. 1 is a vertical schematic cross-sectional view for schematically illustrating a structure of a silicon carbide semiconductor device according to a first embodiment of the present invention.

[Description of Embodiments of the Present Invention]
Embodiments of the present invention will initially be listed and described.

(1) A silicon carbide semiconductor device 1 according to one manner of the present invention includes a silicon carbide substrate 10, a gate insulating film 15, a gate electrode 27, a first electrode 16, and a second electrode 20. Silicon carbide substrate 10 has a first main surface 10a and a second main surface 10b opposite to the first main surface. Silicon carbide substrate 10 includes a first impurity region 12 having a first conductivity type, a second impurity region 13 which is in contact with first impurity region 12 and has a second conductivity type different from the first conductivity type, a third impurity region 14 which has the first conductivity type and is spaced apart from first impurity region 12 by second impurity region 13, and a fourth impurity region 17 which has the second conductivity type and is higher in impurity concentration than second impurity region 13. In first main surface 10a of silicon carbide substrate 10, a first trench T1 having a first side surface S1 and a first bottom portion B1 is formed, first side surface S1 continuous to first main surface 10a and being in contact with third impurity region 14, second impurity region 13, and first impurity region 12, first bottom portion B1 continuous to first side surface S1, and in first main surface 10a, a second trench T2 having a second side surface S2 and a second bottom portion B2 is formed, second side surface S2 continuous to first main surface 10a and being in contact with third impurity region 14 and second impurity region 13, second bottom portion B2 continuous to second side surface S2. Fourth impurity region 17 has a first region 17b arranged between second main surface 10b and second impurity region 13 and a second region 18 connecting second bottom portion B2 of second trench T2 and first region 17b to each other. Gate insulating film 15 is in contact with first impurity region 12, second impurity region 13, and third impurity region 14 at first side surface S1 of first trench T1. Gate electrode 27 is provided on gate insulating film 15. First electrode 16 is electrically connected to third impurity region 14 on a side of first main surface 10a and is in contact with second region 18 at second bottom portion B2 of second trench T2. Second electrode 20 is electrically connected to first impurity region 12 on a side of second main surface 10b. Fourth impurity region 17 is electrically connected to first electrode 16.

According to silicon carbide semiconductor device 1 according to (1) above, first electrode 16 is electrically connected to third impurity region 14 on the side of first main surface 10a and is in contact with second region 18 at second bottom portion B2 of second trench T2. Since first electrode 16 is thus formed in proximity to first region 17b, a resistance between first electrode 16 and first region 17b can be lowered. Since first region 17b can consequently be fixed in potential to first electrode 16 in a stable manner, a silicon carbide semiconductor device fast in response can be obtained. Since first region 17b is arranged between second main surface 10b and second impurity region 13, application of high electric field to second impurity region 13 can be suppressed. Therefore, a silicon carbide semiconductor device fast in response and high in reliability can be obtained.

(2) In silicon carbide semiconductor device 1 according to (1) above, preferably, second region 18 has a third region 18b in contact with first impurity region 12 and first region 17b and a fourth region 18a which passes through second impurity region 13 and connects second bottom portion B2 of second trench T2 and third region 18b to each other. Thus, first region 17b can effectively be fixed in potential to first electrode 16.

(3) In silicon carbide semiconductor device 1 according to (2) above, preferably, a side surface 18b2 of third region 18b is provided to protrude toward first side surface S1 of first trench T1 relative to a side surface 17b2 of first region 17b. Thus, electric field is once narrowed by first region 17b and then electric field is further narrowed by third region 18b, so that high electric field can be prevented from being directly applied to second impurity region 13.

(4) In silicon carbide semiconductor device 1 according to (2) above, preferably, side surface 18b2 of third region 18b is provided to retract toward a side opposite to first side surface S1 of first trench T1 relative to side surface 17b2 of first region 17b. Thus, electric field is once narrowed by first region 17b and then electric field is spread by third region 18b in a direction in parallel to first main surface 10a so that intensity of electric field applied to second impurity region 13 can be reduced.

(5) In silicon carbide semiconductor device 1 according to (1) above, preferably, in second bottom portion B2 of second trench T2, a third trench T3 having a third side surface S3 continuous to second bottom portion B2 and a third bottom portion B3 continuous to third side surface S3 is provided. Second region 18 has a fifth region 18c in contact with third side surface S3 of third trench T3 and second bottom portion B2 of second trench T2 and a sixth region 18f being in contact with first region 17b and electrically connected to fifth region 18c. Occurrence of punch through between third impurity region 14 and first impurity region 12 can be suppressed by fifth region 18c in contact with each of third side surface S3 of third trench T3 and second bottom portion B2 of second trench T2.

(6) In silicon carbide semiconductor device 1 according to any of (1) to (5) above, preferably, fourth impurity region 17 further has a seventh region 17c which faces first bottom portion B1 of first trench T1 and is electrically connected to first electrode 16. Since concentration of electric field at first bottom portion B1 of first trench T1 can thus be relaxed, a silicon carbide semiconductor device higher in reliability can be obtained.

(7) In silicon carbide semiconductor device 1 according to (6) above, preferably, fourth impurity region 17 further includes an eighth region 17d which connects a part of one side in a direction of a major axis of first region 17b and a part of one side in a direction of a major axis of seventh region 17c to each other when viewed in a direction perpendicular to second main surface 10b. Second bottom portion B2 of second trench T2 is located on a region where first region 17b and eighth region 17d intersect with each other. Since both of first region 17b and seventh region 17c can effectively be connected to first electrode 16, a switching speed can be improved.

(8) In silicon carbide semiconductor device 1 according to any of (1) to (7) above, preferably, a width of first bottom portion B1 in the direction of the major axis of first bottom portion B1 of first trench T1 is longer than a width of second bottom portion B2 of second trench T2 in the direction of the major axis of first bottom portion B1 when viewed in the direction perpendicular to second main surface 10b. A characteristic on-resistance can thus be lowered.

(9) A method for manufacturing silicon carbide semiconductor device 1 according to one manner of the present invention includes steps below. Silicon carbide substrate 10 having first main surface 10a and second main surface 10b opposite to first main surface 10a is prepared. Silicon carbide substrate 10 includes first impurity region 12 having a first conductivity type, second impurity region 13 which is in contact with first impurity region 12 and has a second conductivity type different from the first conductivity type, third impurity region 14 which has the first conductivity type and is spaced apart from first impurity region 12 by second impurity region 13, and fourth impurity region 17 which has the second conductivity type and is higher in impurity concentration than second impurity region 13. In first main surface 10a of silicon carbide substrate 10, first trench T1 having first side surface S1 and first bottom portion B1 is formed, first side surface S1 continuous to first main surface 10a and being in contact with third impurity region 14, second impurity region 13, and first impurity region 12, first bottom portion B1 continuous to first side surface S1, and in first main surface 10a, second trench T2 having second side surface S2 and second bottom portion B2 is formed, second side surface S2 continuous to first main surface 10a and being in contact with third impurity region 14 and second impurity region 13, second bottom portion B2 continuous to second side surface S2. Fourth impurity region 17 has first region 17b arranged between second main surface 10b and second impurity region 13 and second region 18 connecting second bottom portion B2 of second trench T2 and first region 17b to each other. Gate insulating film 15 in contact with first impurity region 12, second impurity region 13, and third impurity region 14 at first side surface S1 of first trench T1 is formed. Gate electrode 27 is formed on gate insulating film 15. First electrode 16 electrically connected to third impurity region 14 on the side of first main surface 10a and being in contact with second region 18 at second bottom portion B2 of second trench T2 is formed. Second electrode 20 electrically connected to first impurity region 12 on the side of second main surface 10b is formed. Fourth impurity region 17 is electrically connected to first electrode 16.

According to the method for manufacturing silicon carbide semiconductor device 1 according to (9) above, first electrode 16 is electrically connected to third impurity region 14 on the side of first main surface 10a and is in contact with second region 18 at second bottom portion B2 of second trench T2. Since first electrode 16 is thus formed in proximity to first region 17b, a resistance between first electrode 16 and first region 17b can be lowered. Since first region 17b can consequently be fixed in potential to first electrode 16 in a stable manner, a silicon carbide semiconductor device fast in response can be obtained. Since first region 17b is arranged between second main surface 10b and second impurity region 13, application of high electric field to second impurity region 13 can be suppressed. Therefore, a silicon carbide semiconductor device fast in response and high in reliability can be obtained.

(10) In the method for manufacturing silicon carbide semiconductor device 1 according to (9) above, preferably, second region 18 has third region 18b in contact with first impurity region 12 and first region 17b and fourth region 18a which passes through second impurity region 13 and connects second bottom portion B2 of second trench T2 and third region 18b to each other. Forming silicon carbide substrate 10 includes forming a first portion 12c of first impurity region 12 through epitaxial growth, forming first region 17b by implanting ions into first portion 12c of first impurity region 12, forming second portion 12a of first impurity region 12 on first portion 12c of first impurity region 12 and first region 17b through epitaxial growth, forming third region 18b by implanting ions into second portion 12a of the first impurity region, forming second impurity region 13 on third region 18b and second portion 12a through epitaxial growth, forming third impurity region 14 by implanting ions into second impurity region 13, forming second trench T2 having second side surface S2 in contact with third impurity region 14 and second impurity region 13 and second bottom portion B2 in contact with second impurity region 13, and forming fourth region 18a by implanting ions into second bottom portion B2 of second trench T2. Since ions are implanted into second bottom portion B2 of second trench T2 after second trench T2 is formed, ions can be implanted deep into silicon carbide substrate 10 with relatively low ion implantation energy. Therefore, load imposed in an ion implanting step can be reduced.

(11) In the method for manufacturing silicon carbide semiconductor device 1 according to (10) above, preferably, side surface 18b2 of third region 18b is provided to protrude toward first side surface S1 of first trench T1 relative to side surface 17b2 of first region 17b. Thus, electric field is once narrowed by first region 17b and then electric field is further narrowed by third region 18b, so that high electric field can be prevented from being directly applied to second impurity region 13.

(12) In the method for manufacturing silicon carbide semiconductor device 1 according to (10) above, preferably, side surface 18b2 of third region 18b is provided to retract toward a side opposite to first side surface S1 of first trench T1 relative to side surface 17b2 of first region 17b. Thus, electric field is once narrowed by first region 17b and then electric field is spread by third region 18b in a direction in parallel to first main surface 10a so that intensity of electric field applied to second impurity region 13 can be reduced.

(13) In the method for manufacturing silicon carbide semiconductor device 1 according to (9) above, preferably, forming silicon carbide substrate 10 includes forming first portion 12c of first impurity region 12 through epitaxial growth, forming first region 17b by implanting ions into first portion 12c, forming second portion 12a of first impurity region 12 on first portion 12c and first region 17b through epitaxial growth, forming second impurity region 13 on second portion 12a through epitaxial growth, forming third impurity region 14 by implanting ions into second impurity region 13, forming second trench T2 having second side surface S2 in contact with third impurity region 14 and second impurity region 13 and second bottom portion B2 in contact with second impurity region 13, forming a third portion 46 having the second conductivity type and being in contact with second portion 12a while third portion 46 is spaced apart from first region 17b, by implanting ions into second bottom portion B2 of second trench T2, forming third trench T3 having third side surface S3 continuous to second bottom portion B2 of second trench T2 and being in contact with third portion 46 and third bottom portion B3 continuous to third side surface S3, and forming a fourth portion 18f having the second conductivity type and connecting third portion 46 and first region 17b to each other by implanting ions into third bottom portion B3 of third trench T3. Since first electrode 16 is formed in further proximity to first region 17b, a resistance between first electrode 16 and first region 17b can further be lowered. Since first region 17b can consequently be fixed in potential to first electrode 16 in a more stable manner, a silicon carbide semiconductor device faster in response can be obtained.

(14) In the method for manufacturing silicon carbide semiconductor device 1 according to any of (9) to (13) above, preferably, fourth impurity region 17 further has seventh region 17c which faces first bottom portion B1 of first trench T1 and is electrically connected to first electrode 16. Since concentration of electric field at first bottom portion B1 of first trench T1 can thus be relaxed, a silicon carbide semiconductor device higher in reliability can be obtained.

(15) In the method for manufacturing silicon carbide semiconductor device 1 according to (9) above, preferably, second region 18 has third region 18b in contact with first impurity region 12 and first region 17b and fourth region 18a which passes through second impurity region 13 and connects second bottom portion B2 of second trench T2 and third region 18b to each other. Forming silicon carbide substrate 10 includes forming first portion 12c of first impurity region 12 through epitaxial growth, forming first region 17b, second portion 12a of first impurity region 12 located on first portion 12c of first impurity region 12 and first region 17b, and third region 18b by implanting ions into first portion 12c of first impurity region 12, forming second impurity region 13 on third region 18b and second portion 12a through epitaxial growth, forming third impurity region 14 by implanting ions into second impurity region 13, forming second trench T2 having second side surface S2 in contact with third impurity region 14 and second impurity region 13 and second bottom portion B2 in contact with second impurity region 13, and forming fourth region 18a by implanting ions into second bottom portion B2 of second trench T2. A resistance between first electrode 16 and first region 17b can thus be lowered. Since first region 17b can consequently be fixed in potential to first electrode 16 in a stable manner, a silicon carbide semiconductor device fast in response can be obtained.

[Details of Embodiments of the Present Invention]

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ) and { }, respectively. Moreover, a crystallographically negative index is expressed by a number with a bar "-" thereabove, however, a negative sign herein precedes a number.

(First Embodiment)

A construction of a MOSFET representing a silicon carbide semiconductor device according to a first embodiment of the present invention will initially be described.

Referring to FIG. 1, a MOSFET 1 according to the first embodiment mainly has silicon carbide substrate 10, gate electrode 27, gate insulating film 15, an interlayer insulating film 21, a source electrode 16, a source interconnection 19, a drain electrode 20, and a protecting film 24. Silicon carbide substrate 10 has first main surface 10a and second main surface 10b opposite to first main surface 10a, and mainly includes a silicon carbide single-crystal substrate 11 and a silicon carbide epitaxial layer 5 provided on silicon carbide single-crystal substrate 11. Silicon carbide single-crystal substrate 11 forms second main surface 10b of silicon carbide substrate 10 and silicon carbide epitaxial layer 5 forms first main surface 10a of silicon carbide substrate 10.

Silicon carbide single-crystal substrate 11 is composed of single crystals of hexagonal silicon carbide having, for example, a polytype of 4H. First main surface 10a of silicon carbide substrate 10 has a maximal diameter, for example, of 150 mm and more preferably not smaller than 150 mm. First main surface 10a of silicon carbide substrate 10 is, for example, a {0001} plane or a surface angled off by not greater than 8° from the {0001} plane. Silicon carbide single-crystal substrate 11 has a thickness, for example, of 400 μm. Silicon carbide single-crystal substrate 11 has a resistivity, for example, of 0.017 Ωcm.

Silicon carbide epitaxial layer 5 mainly has a drift region 12 (first impurity region 12), a base region 13 (second impurity region 13), a source region 14 (third impurity region 14), fourth impurity region 17, and a buffer layer 22. Drift region 12 is an n-type (a first conductivity type) region containing an n-type impurity (a donor) for providing the n-type such as nitrogen. Drift region 12 has a third drift region 12c provided on buffer layer 22, a second drift region 12b provided on third drift region 12c, and a first drift region 12a provided on second drift region 12b. First drift region 12a is in contact with base region 13. Second drift region 12b is in contact with first drift region 12a and located opposite to base region 13 when viewed from first drift region 12a. Third drift region 12c is in contact with second drift region 12b and located opposite to first drift region 12a when viewed from second drift region 12b. Buffer layer 22 is higher in impurity concentration, for example, than third drift region 12c, and provided between silicon carbide single-crystal substrate 11 and third drift region 12c.

Base region 13 is provided on each of first drift region 12a in drift region 12 and third region 18b in fourth impurity region 17. Base region 13 is a region of the p-type (a second conductivity type) different from the n-type. Base region 13 contains a p-type impurity (an acceptor) for providing the p-type such as aluminum (Al) or boron (B). Preferably, a concentration of a p-type impurity in base region 13 is not lower than $1 \times 10^{15}$ cm$^{-3}$ and not higher than $4 \times 10^{17}$ cm$^{-3}$, more preferably not lower than $3 \times 10^{15}$ cm$^{-3}$ and not higher than $3 \times 10^{16}$ cm$^{-3}$, and further preferably not lower than $5 \times 10^{15}$ cm$^{-3}$ and not higher than $1 \times 10^{16}$ cm$^{-3}$. A concentration of a p-type impurity in base region 13 is preferably not lower than $5 \times 10^{15}$ cm$^{-3}$. Base region 13 is an epitaxial layer formed, for example, through epitaxial growth. Base region 13 has a thickness, for example, not smaller than 0.5 μm and not greater than 1.5 μm.

Source region 14 is provided on base region 13 as being spaced apart from drift region 12 by base region 13. Source region 14 contains an n-type impurity for providing the n-type such as phosphorus, and has the n-type. Source region 14 is higher in concentration of an n-type impurity than each of first drift region 12a, second drift region 12b, and third drift region 12c in drift region 12. A concentration of an n-type impurity such as phosphorus contained in source region 14 is, for example, not lower than $2 \times 10^{18}$ cm$^{-3}$ and not higher than $1 \times 10^{19}$ cm$^{-3}$. Source region 14 has a thickness, for example, not smaller than 0.1 μm and not greater than 0.4 μm.

First trench T1 having first side surface S1 continuous to first main surface 10a and first bottom portion B1 continuous to first side surface S1 is formed in first main surface 10a of silicon carbide substrate 10. First side surface S1 of first trench T1 passes through each of source region 14 and base region 13 and reaches first drift region 12a in drift region 12. First bottom portion B1 of first trench T1 is located in first drift region 12a in drift region 12. First drift region 12a, base region 13, and source region 14 are in contact with first side surface S1 of the first trench and first drift region 12a is in contact with first bottom portion B1 of first trench T1. First side surface S1 of first trench T1 extends along a direction substantially perpendicular to first main surface 10a of silicon carbide substrate 10, and first bottom portion B1 of first trench T1 is substantially in parallel to first main surface 10a of silicon carbide substrate 10. A boundary between first side surface S1 and first bottom portion B1 of first trench T1 may be formed to have a curvature. First trench T1 has a depth, for example, not smaller than 0.5 μm and not greater than 2.3 μm. First trench T1 has a width, for example, not smaller than 0.5 μm and not greater than 3 μm.

Second trench T2 having second side surface S2 continuous to first main surface 10a and second bottom portion B2 continuous to second side surface S2 is formed in first main surface 10a of silicon carbide substrate 10. Second side surface S2 of second trench T2 passes through source region 14 and reaches base region 13. Second bottom portion B2 of second trench T2 is located in base region 13. Second side surface S2 of second trench T2 is in contact with third impurity region 14 and second impurity region 13. Second bottom portion B2 of second trench T2 is in contact with second region 18 in fourth impurity region 17.

Fourth impurity region 17 contains a p-type impurity such as aluminum or boron and has the p-type. Fourth impurity region 17 is higher in impurity concentration than base region 13. Fourth impurity region 17 is electrically connected to source electrode 16. Fourth impurity region 17 mainly includes first region 17b, seventh region 17c, and second region 18. A concentration of a p-type impurity such as aluminum contained in each of first region 17b, seventh region 17c, and second region 18 is, for example, not lower than $1 \times 10^{18}$ cm$^{-3}$ and not higher than $2 \times 10^{19}$ cm$^{-3}$ and preferably not lower than $2 \times 10^{18}$ cm$^{-3}$ and not higher than $9 \times 10^{18}$ cm$^{-3}$. Seventh region 17c faces first bottom portion B1 of first trench T1 and a part of base region 13 and is electrically connected to first electrode 16. Seventh region 17c covers the entire first bottom portion B1 of first trench T1 and extends along a direction from first side surface S1 of first trench T1 toward base region 13. Preferably, seventh region 17c is arranged to cover the entire channel region CH in base region 13 in contact with gate insulating film 15. When viewed along a direction in parallel to second main surface 10b of silicon carbide substrate 10 (a field of view in FIG. 1), seventh region 17c is greater in width than first bottom portion B1 of first trench T1. Seventh region 17c has a thickness, for example, not smaller than 0.5 μm and not greater than 1.5 μm. Seventh region 17c is in contact with second drift region 12b in the direction in parallel to second main surface 10b and lies between first drift region 12a and third drift region 12c in the direction perpendicular to second main surface 10b.

First region 17b is arranged between second main surface 10b and base region 13. First region 17b is arranged between third region 18b and third drift region 12c in the direction perpendicular to second main surface 10b and arranged as being in contact with second drift region 12b in the direction in parallel to second main surface 10b. Second region 18 connects second bottom portion B2 of second trench T2 and first region 17b to each other. Preferably, second region 18 has third region 18b in contact with drift region 12 and first region 17b and fourth region 18a which passes through base region 13 and connects second bottom portion B2 of second trench T2 and third region 18b to each other. Third region 18b is in contact with first drift region 12a in the direction in parallel to second main surface 10b and lies between first region 17b and fourth region 18a in the direction perpendicular to second main surface 10b.

Third region 18b is provided to face base region 13. Third region 18b is provided between base region 13 and second main surface 10b. In the direction in parallel to second main surface 10b, third region 18b may be greater in width than fourth region 18a. Preferably, third region 18b is provided as being in contact with fourth region 18a and base region 13. Third region 18b has a thickness, for example, not smaller than 0.5 μm and not greater than 1.5 μm.

A surface 17c1 of seventh region 17c facing second main surface 10b is located on the side of second main surface 10b in the direction perpendicular to second main surface 10b relative to a surface 18b1 of third region 18b facing second main surface 10b. In other words, in the direction perpendicular to second main surface 10b, a distance between second main surface 10b and surface 17c1 of seventh region 17c is shorter than second main surface 10b and surface 18b1 of third region 18b. A side surface 18b2 of third region 18b is provided to retract toward a side opposite to first side surface S1 of first trench T1 relative to side surface 17b2 of first region 17b. In the direction in parallel to second main surface 10b, third region 18b may be equal in width to first region 17b.

Preferably, a distance a between base region 13 and seventh region 17c in the direction perpendicular to second main surface 10b is not smaller than 0.2 μm and not greater than 2 μm. Distance a is equal to a thickness of first drift region 12a in contact with base region 13. More preferably, distance a is not smaller than 0.5 μm and not greater than 0.7 μm.

Preferably, a distance b between a point of contact between first side surface S1 and first bottom portion B1 of first trench T1 and a side surface 17c2 of seventh region 17c in the direction in parallel to second main surface 10b is not smaller than 0.1 μm and not greater than 0.5 μm. Distance b is equal to a width of seventh region 17c facing base region 13. More preferably, distance b is not smaller than 0.2 μm and not greater than 0.4 μm.

Preferably, a distance c between side surface 17c2 of seventh region 17c and side surface 17a2 of third region 18b in the direction in parallel to second main surface 10b is not smaller than 0.6 μm and not greater than 1.5 μm. Distance c is equal to a value calculated by subtracting distance a from the width of first drift region 12a lying between first side surface S1 of first trench T1 and third region 18b. More preferably, distance c is not smaller than 0.7 μm and not greater than 1 μm.

Preferably, distance c between side surface 17c2 of seventh region 17c and side surface 18b2 of third region 18b in the direction in parallel to second main surface 10b is longer than a distance d between side surface 17c2 of seventh region 17c and side surface 17b2 of first region 17b. Distance d is equal to a width of second drift region 12b lying between seventh region 17c and first region 17b. Distance d in the direction in parallel to second main surface 10b is, for example, not smaller than 0.5 μm and not greater than 1.5 μm, preferably not smaller than 0.7 μm and not greater than 1.5 μm, and further preferably not smaller than 0.7 μm and not greater than 1.0 μm.

Figure 2:
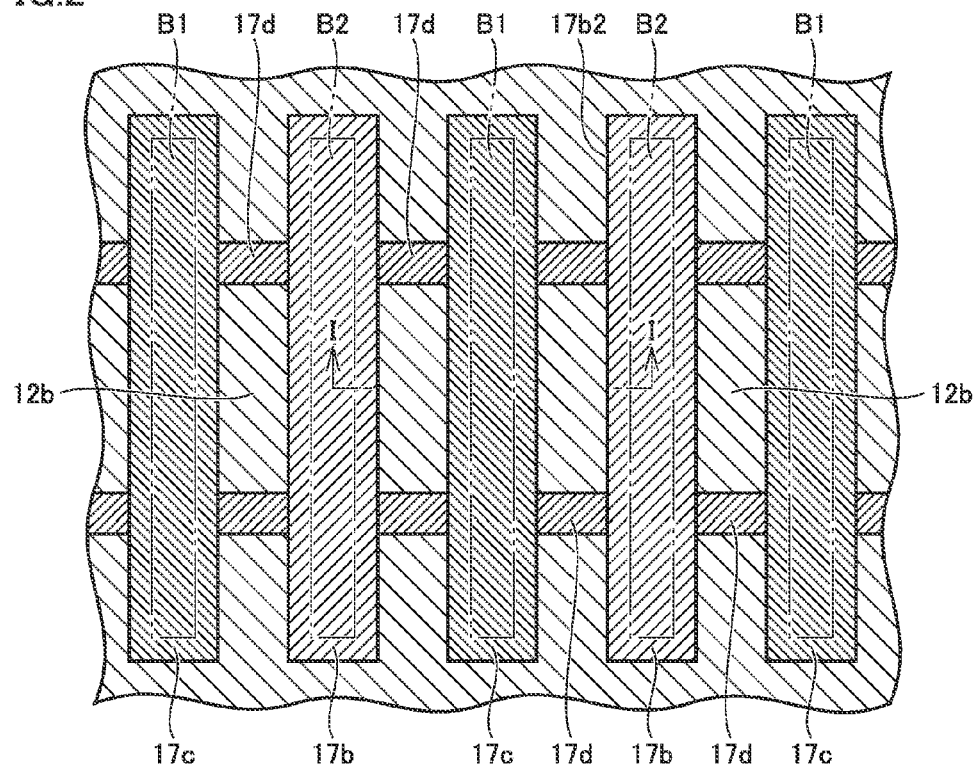
FIG. 2 is a lateral schematic cross-sectional view along a region II-II in FIG. 1.

Referring to FIG. 2, in a plan view (a field of view along the direction perpendicular to second main surface 10b), each of seventh region 17c and first region 17b is in an elongated (for example, rectangular) shape having, for example, a major axis and a minor axis. In the plan view, first bottom portion B1 of first trench T1 is arranged to be superimposed on seventh region 17c. First bottom portion B1 of first trench T1 extends along a direction of the major axis of seventh region 17c. Fourth impurity region 17 includes a connection portion 17d (an eighth region 17d) which connects seventh region 17c and first region 17b to each other. Connection portion 17d connects a part of one side in the direction of the major axis of first region 17b and a part of one side in the direction of the major axis of seventh region 17c when viewed in the direction perpendicular to second main surface 10b. Connection portion 17d contains a p-type impurity such as aluminum and has the p-type. In the plan view, second drift region 12b is arranged to be surrounded by seventh region 17c, first region 17b, and connection portion 17d. A plurality of connection portions 17d may be arranged along the direction of the major axis of seventh region 17c. A plurality of connection portions 17d may be arranged along a direction of the minor axis of seventh region 17c. In the plan view, second bottom portion B2 of second trench T2 is arranged to be superimposed on first region 17b. Second bottom portion B2 of second trench T2 extends along the direction of the major axis of first region 17b. A direction of a major axis of second bottom portion B2 of second trench T2 is substantially in parallel to the direction of the major axis of first bottom portion B1 of first trench T1.

Figure 15:
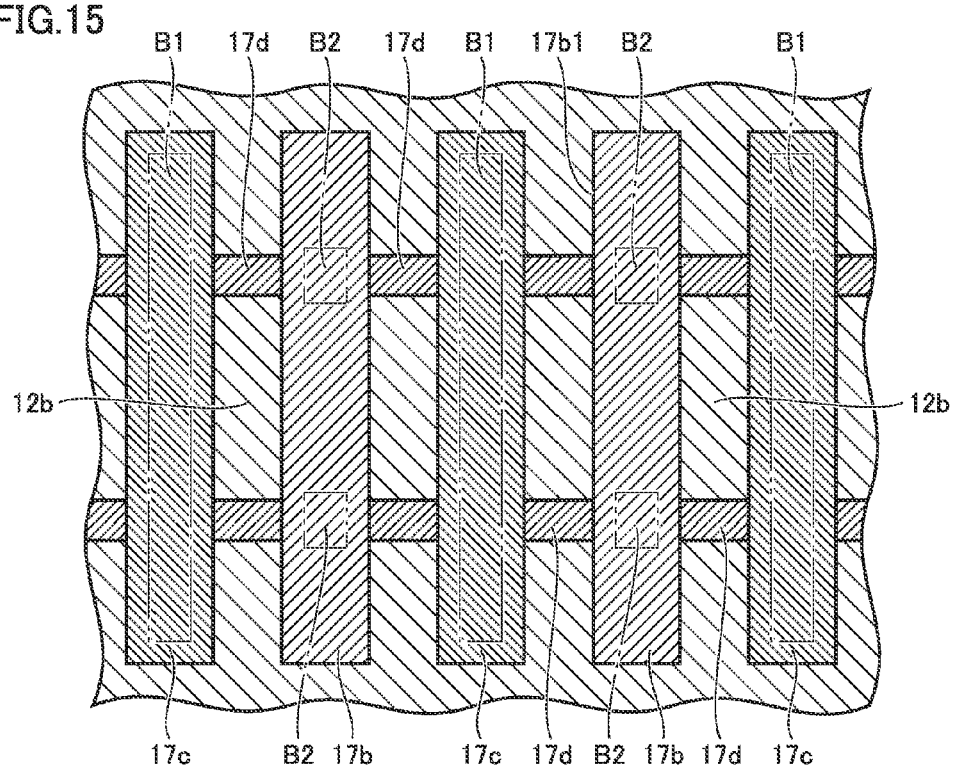
FIG. 15 is a lateral schematic cross-sectional view along region II-II in a modification of the silicon carbide semiconductor device shown in FIG. 1.

Referring to FIG. 15, in a plan view, second bottom portion B2 of second trench T2 is preferably located on a region where first region 17b and eighth region 17d intersect with each other. Two adjacent second trenches T2 are provided as being spaced apart from each other in the direction of the major axis of first region 17b. Source region 14, base region 13, and first drift region 12a may be provided under a region lying between two adjacent second trenches T2. When viewed in the direction perpendicular to second main surface 10b, a width of first bottom portion B1 in the direction of the major axis of first bottom portion B1 of first trench T1 may be longer than a width of second bottom portion B2 of second trench T2 in the direction of the major axis of first bottom portion B1.

Referring to FIG. 1, first drift region 12a in drift region 12 is in contact with first side surface S1 of first trench T1, base region 13, seventh region 17c, third region 18b, second drift region 12b, and first region 17b. Third drift region 12c in drift region 12 is located on the side of second main surface 10b relative to first drift region 12a, electrically connected to first drift region 12a, and lower in impurity concentration than first drift region 12a. Second drift region 12b in drift region 12 is arranged as lying between first drift region 12a and third drift region 12c in the direction perpendicular to second main surface 10b and arranged as lying between seventh region 17c and first region 17b in the direction in parallel to second main surface 10b. Second drift region 12b is preferably higher in concentration of an n-type impurity than third drift region 12c. Preferably, an impurity concentration in each of first drift region 12a and second drift region 12b is not lower than $1\times10^{16}$ cm$^{-3}$ and not higher than $4\times10^{17}$ cm$^{-3}$ and more preferably not lower than $2\times10^{16}$ cm$^{-3}$ and not higher than $2\times10^{17}$ cm$^{-3}$. Second drift region 12b has a thickness, for example, not smaller than 0.4 μm and not greater than 1.5 μm. First drift region 12a has a thickness, for example, not smaller than 0.2 μm and not greater than 1.0 μm.

A concentration of an impurity such as nitrogen contained in third drift region 12c and a thickness of third drift region 12c vary depending on a breakdown voltage. When a breakdown voltage is set to 1200 V, third drift region 12c has a thickness, for example, of approximately 10 μm and a concentration of nitrogen contained in third drift region 12c is approximately $1\times10^{16}$ cm$^{-3}$. When a breakdown voltage is set to 1700 V, third drift region 12c has a thickness, for example, of approximately 20 μm and a concentration of nitrogen contained in third drift region 12c is approximately $5\times10^{15}$ cm$^{-3}$. When a breakdown voltage is set to 3300 V, third drift region 12c has a thickness, for example, of approximately 30 μm and a concentration of nitrogen contained in third drift region 12c is approximately $3\times10^{15}$ cm$^{-3}$.

Preferably, a concentration of an n-type impurity such as nitrogen contained in buffer layer 22 is lower than a concentration of an n-type impurity such as nitrogen contained in silicon carbide single-crystal substrate 11. A concentration of an n-type impurity such as nitrogen contained in silicon carbide single-crystal substrate 11 is, for example, not lower than $5\times10^{18}$ cm$^{-3}$ and not higher than $9\times10^{18}$ cm$^{-3}$. A concentration of an n-type impurity such as nitrogen contained in buffer layer 22 is, for example, not lower than $1\times10^{18}$ cm$^{-3}$ and not higher than $2\times10^{18}$ cm$^{-3}$. An element and a concentration of an impurity contained in each impurity region can be measured, for example, with a scanning capacitance microscope (SCM) or secondary ion mass spectrometry (SIMS).

Gate insulating film 15 is composed, for example, of silicon dioxide and provided as being in contact with first side surface S1 and first bottom portion B1 of first trench T1. Gate insulating film 15 is in contact with first drift region 12a, base region 13, and source region 14 at first side surface S1 of first trench T1 and in contact with first drift region 12a at first bottom portion B1 of first trench T1. Channel region CH can be formed in base region 13 in contact with gate insulating film 15. Gate insulating film 15 has a thickness, for example, not smaller than 50 nm and not greater than 150 nm.

Gate electrode 27 is provided on gate insulating film 15. Gate electrode 27 is arranged as being in contact with gate insulating film 15 and provided to bury a groove defined by gate insulating film 15. Gate electrode 27 may be provided at a position opposed to first main surface 10a. Gate electrode 27 is composed, for example, of a conductor such as polysilicon doped with an impurity.

Source electrode 16 is composed, for example, of a material containing Ni and Ti. Source electrode 16 is electrically connected to source region 14 on the side of first main surface 10a of silicon carbide substrate 10. Source electrode 16 is in contact with source region 14 and base region 13 at second side surface S2 of second trench T2 and is in contact with second region 18 at second bottom portion B2 of second trench T2. Source electrode 16 includes an alloy layer in ohmic contact with source region 14. The alloy layer is composed, for example, of a silicide with a metal contained in source electrode 16. Preferably, source electrode 16 is composed of a material containing Ti, Al, and Si.

Interlayer insulating film 21 is provided at a position opposed to first main surface 10a of silicon carbide substrate 10. Specifically, interlayer insulating film 21 is provided as being in contact with each of gate electrode 27 and gate insulating film 15 so as to cover gate electrode 27. Interlayer insulating film 21 includes, for example, a tetra ethyl ortho silicate (TEOS) oxide film and phosphorus silicon glass (PSG). Interlayer insulating film 21 electrically isolates gate electrode 27 and source electrode 16 from each other. Source interconnection 19 is provided to cover interlayer insulating film 21 and to be in contact with source electrode 16. Source interconnection 19 is in contact with source electrode 16, for example, in the inside of second trench T2. Source interconnection 19 is electrically connected to source region 14 with source electrode 16 being interposed. Source interconnection 19 is composed of a material containing, for example, AlSiCu. Protecting film 24 is provided on source interconnection 19 so as to cover source interconnection 19. Protecting film 24 includes, for example, a nitride film and polyimide.

Drain electrode 20 is provided as being in contact with second main surface 10b of silicon carbide substrate 10. Drain electrode 20 is electrically connected to third drift region 12c on the side of second main surface 10b. Drain electrode 20 is composed of a material such as nickel silicide (NiSi) which can establish ohmic contact with n-type silicon carbide single-crystal substrate 11. Drain electrode 20 is thus electrically connected to silicon carbide single-crystal substrate 11.

An operation of MOSFET 1 according to the first embodiment will now be described. Referring to FIG. 1, when a voltage applied to gate electrode 27 is lower than a threshold voltage, that is, in an off state, even with application of a voltage across source electrode 16 and drain electrode 20, a pn junction formed between base region 13 and first impurity region 12 is reverse biased and is in a non-conducting state. When a voltage not lower than the threshold voltage is applied to gate electrode 27, an inversion layer is formed in channel region CH which is around a portion in base region 13 in contact with gate insulating layer 15. Consequently, source region 14 and first impurity region 12 are electrically connected to each other and a current flows between source electrode 16 and drain electrode 20. MOSFET 1 operates as above.

A method for manufacturing MOSFET 1 as the silicon carbide semiconductor device according to the first embodiment will now be described.

Figure 4:
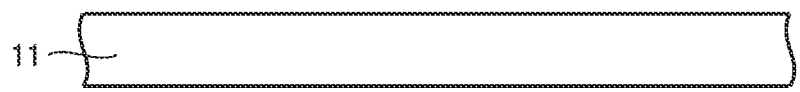
FIG. 4 is a schematic cross-sectional view for schematically illustrating a first step in the method for manufacturing the silicon carbide semiconductor device according to the first embodiment of the present invention.

Referring to FIG. 4, silicon carbide single-crystal substrate 11 is prepared, for example, by cutting a substrate by slicing a silicon carbide single-crystal ingot grown with an improved Raleigh method and mirror polishing a surface of the substrate. Silicon carbide single-crystal substrate 11 is composed, for example, of hexagonal silicon carbide having a polytype of 4H. A main surface of silicon carbide single-crystal substrate 11 has a diameter, for example, of 150 mm and a thickness, for example, of 400 µm. The main surface of silicon carbide single-crystal substrate 11 is, for example, a {0001} plane or a surface angled off by not greater than 8° from the {0001} plane.

Figure 3:
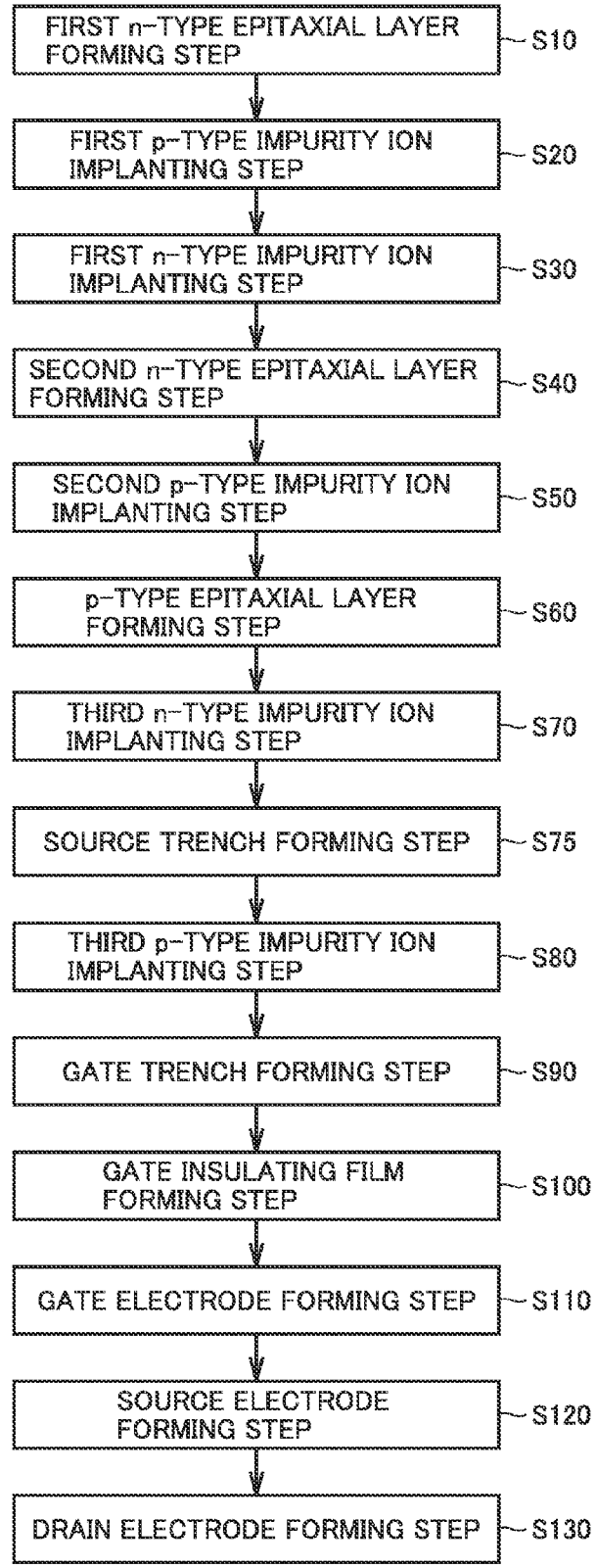
FIG. 3 is a flowchart for schematically illustrating a method for manufacturing the silicon carbide semiconductor device according to the first embodiment of the present invention.
Figure 5:
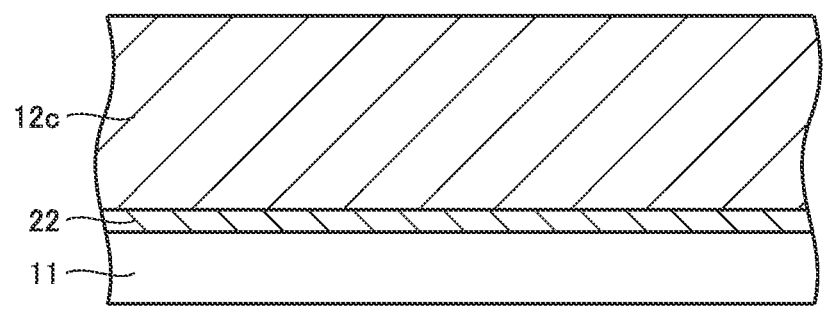
FIG. 5 is a schematic cross-sectional view for schematically illustrating a second step in the method for manufacturing the silicon carbide semiconductor device according to the first embodiment of the present invention.

Then, a first n-type epitaxial layer forming step (S10: FIG. 3) is performed. For example, a carrier gas containing hydrogen, a source material gas containing silane and propane, and a dopant gas containing nitrogen are supplied over silicon carbide single-crystal substrate 11, and silicon carbide single-crystal substrate 11 is heated, for example, to a temperature around 1550° C. under a pressure of 100 mbar (10 kPa). Thus, as shown in FIG. 5, a silicon carbide epitaxial layer having the n-type is formed on silicon carbide single-crystal substrate 11. The silicon carbide epitaxial layer has buffer layer 22 formed on silicon carbide single-crystal substrate 11 and has third drift region 12c formed on buffer layer 22. Third drift region 12c is doped with nitrogen at a concentration, for example, of $8.0 \times 10^{15}$ cm$^{-3}$. Third drift region 12c has a thickness, for example, of 10 µm. As above, third drift region 12c (first portion 12c) in drift region 12 is formed through epitaxial growth.

Figure 6:
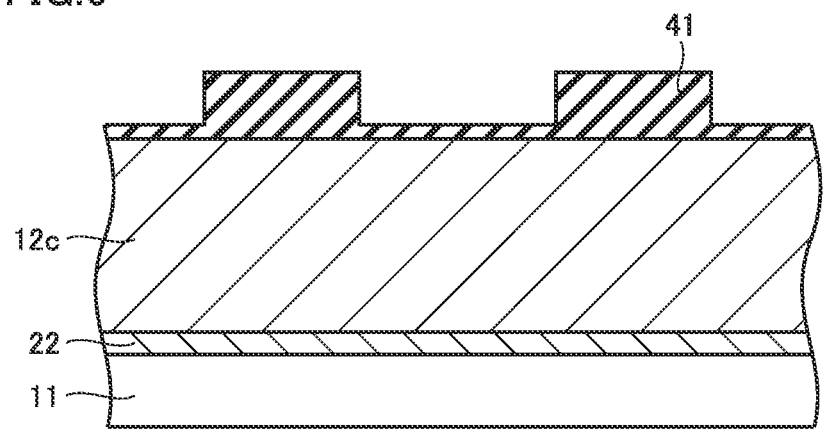
FIG. 6 is a schematic cross-sectional view for schematically illustrating a third step in the method for manufacturing the silicon carbide semiconductor device according to the first embodiment of the present invention.
Figure 7:
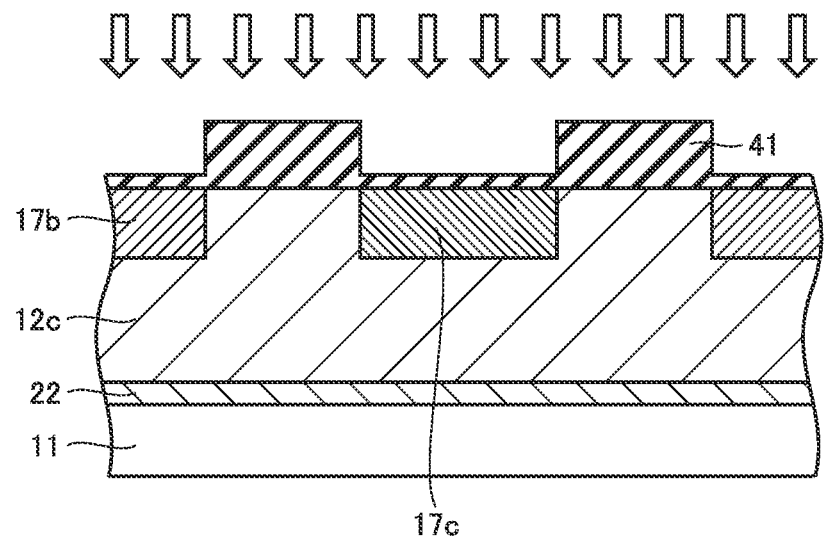
FIG. 7 is a schematic cross-sectional view for schematically illustrating a fourth step in the method for manufacturing the silicon carbide semiconductor device according to the first embodiment of the present invention.

Then, a first p-type impurity ion implanting step (S20: FIG. 3) is performed. Specifically, referring to FIG. 6, an ion implantation mask 41 is formed on third drift region 12c of silicon carbide epitaxial layer 5. Ion implantation mask 41 is composed of a material including a TEOS oxide film and has a thickness, for example, of 1.6 µm. Then, ion implantation mask 41 is subjected to radio frequency (RF) etching using CHF$_3$ and O$_2$. Thus, a through film (a thin region of ion implantation mask 41 in FIG. 6), for example, of approximately 80 nm is left on a portion into which ions are to be implanted. Then, using ion implantation mask 41 having the through film, ions are implanted into third drift region 12c in silicon carbide epitaxial layer 5. For example, aluminum (Al) ions are implanted into silicon carbide epitaxial layer 5 through the through film in a direction shown with an arrow, so that seventh region 17c and first region 17b having the p-type and being higher in impurity concentration than base region 13 are formed (see FIG. 7). A concentration of a p-type impurity such as aluminum contained in each of seventh region 17c and first region 17b is, for example, not lower than $2 \times 10^{18}$ cm$^{-3}$ and not higher than $9 \times 10^{18}$ cm$^{-3}$. A thickness of each of seventh region 17c and first region 17b is, for example, not smaller than 0.5 µm and not greater than 1.5 µm.

Figure 8:
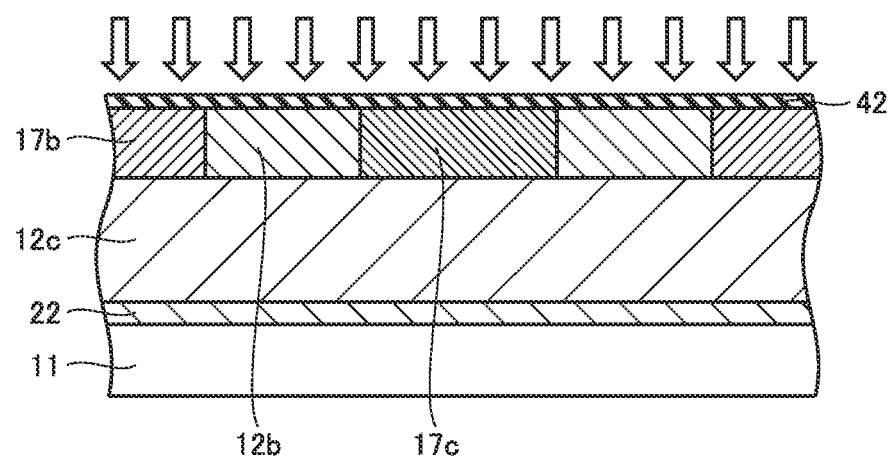
FIG. 8 is a schematic cross-sectional view for schematically illustrating a fifth step in the method for manufacturing the silicon carbide semiconductor device according to the first embodiment of the present invention.

Then, a first n-type impurity ion implanting step (S30: FIG. 3) is performed. Specifically, after ion implantation mask 41 is removed, for example, a through film 42 having a thickness of 80 nm is formed as being in contact with seventh region 17c, first region 17b, and third drift region 12c. Then, for example, nitrogen ions are implanted into seventh region 17c, first region 17b, and third drift region 12c from above through film 42 in a direction shown with an arrow. Thus, in a cross-sectional view, second drift region 12b having the n-type and being higher in impurity concentration than third drift region 12c is formed in a region lying between seventh region 17c and first region 17b. A concentration of an n-type impurity such as nitrogen contained in second drift region 12b is, for example, not lower than $1 \times 10^{16}$ cm$^{-3}$ and not higher than $7 \times 10^{16}$ cm$^{-3}$. Second drift region 12b has a thickness, for example, not smaller than 0.5 µm and not greater than 1.0 µm (see FIG. 8). Then, through film 42 formed on seventh region 17c, first region 17b, and second drift region 12b is removed.

Then, a first n-type epitaxial layer forming step (S40: FIG. 3) is performed. Specifically, first drift region 12a is formed through epitaxial growth while doping with an n-type impurity such as nitrogen is performed. A concentration of the n-type impurity such as nitrogen contained in first drift region 12a is, for example, not lower than $1 \times 10^{16}$ cm$^{-3}$ and not higher than $7 \times 10^{16}$ cm$^{-3}$. First drift region 12a is formed as being in contact with seventh region 17c, first region 17b, and second drift region 12b. First drift region 12a has a thickness, for example, not smaller than 0.3 μm and not greater than 1.0 μm. As above, second portion 12a of drift region 12 is formed on the first portion of drift region 12 (that is, a portion constituted of third drift region 12c and second drift region 12b) and first region 17b through epitaxial growth. First drift region 12a may be formed, for example, as a result of implantation of ions of an n-type impurity such as nitrogen or phosphorus into a silicon carbide epitaxial region such as the first portion. Specifically, first drift region 12a (second portion 12a) located on the first portion and first region 17b may be formed as a result of implantation of ions into the first portion.

Figure 9:
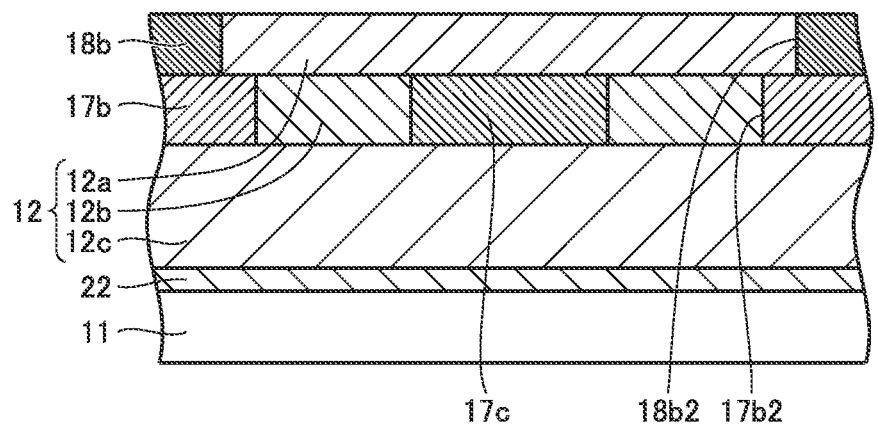
FIG. 9 is a schematic cross-sectional view for schematically illustrating a sixth step in the method for manufacturing the silicon carbide semiconductor device according to the first embodiment of the present invention.

Then, a second p-type impurity ion implanting step (S50: FIG. 3) is performed. Ions are implanted into a part of first drift region 12a in silicon carbide epitaxial layer 5. As a result of implantation of ions of a p-type impurity such as aluminum into a part of first drift region 12a, third region 18b which is in contact with first region 17b and has the p-type is formed (see FIG. 9). A concentration of a p-type impurity such as aluminum contained in third region 18b is, for example, not lower than $2 \times 10^{18}$ cm$^{-3}$ and not higher than $9 \times 10^{18}$ cm$^{-3}$. Third region 18b has a thickness, for example, not smaller than 0.5 μm and not greater than 1.0 μm.

Figure 10:
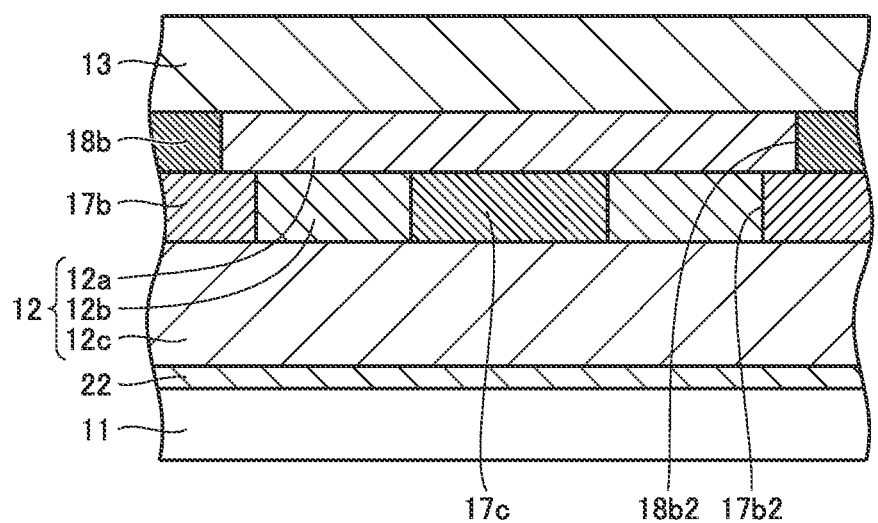
FIG. 10 is a schematic cross-sectional view for schematically illustrating a seventh step in the method for manufacturing the silicon carbide semiconductor device according to the first embodiment of the present invention.

Then, a p-type epitaxial layer forming step (S60: FIG. 3) is performed. Specifically, base region 13 is formed through epitaxial growth while doping with a p-type impurity such as aluminum is performed. A concentration of a p-type impurity such as aluminum contained in base region 13 is, for example, not lower than $5 \times 10^{15}$ cm$^{-3}$ and not higher than $1 \times 10^{17}$ cm$^{-3}$. Base region 13 is formed to be in contact with both of third region 18b and first drift region 12a (see FIG. 10). Base region 13 has a thickness, for example, not smaller than 0.5 μm and not greater than 1.5 μm. Base region 13 may be formed, for example, as a result of implantation of ions of a p-type impurity such as aluminum into the silicon carbide epitaxial layer such as third drift region 12c or first drift region 12a.

Figure 11:
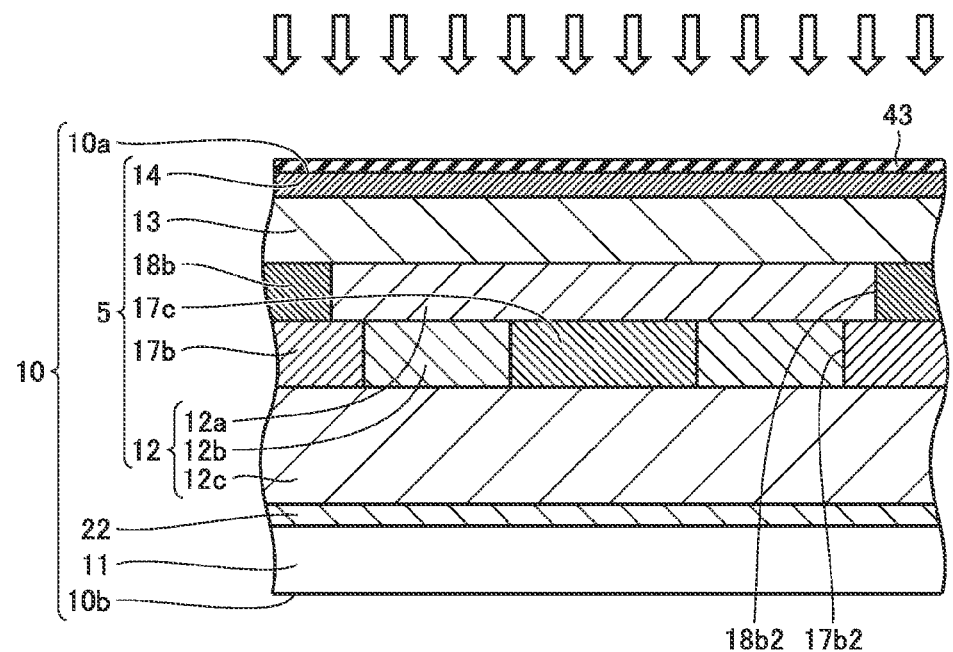
FIG. 11 is a schematic cross-sectional view for schematically illustrating an eighth step in the method for manufacturing the silicon carbide semiconductor device according to the first embodiment of the present invention.

Then, a third n-type impurity ion implanting step (S70: FIG. 3) is performed. Specifically, ions are implanted into base region 13 in silicon carbide epitaxial layer 5. As a result of implantation of ions of an n-type impurity such as phosphorus into base region 13 in silicon carbide epitaxial layer 5 in a direction shown with an arrow, source region 14 having the n-type is formed. Ions of an n-type impurity may be implanted by using a through film 43 formed on base region 13 (see FIG. 11).

Then, a source trench forming step (S75: FIG. 3) is performed. A mask 44 having an opening over a region where second trench T2 (a source trench) is to be formed is formed. Silicon carbide substrate 10 is then etched by using mask 44. For example, silicon carbide substrate 10 is subjected to electron cyclotron resonance (ECR) plasma etching with SF$_6$ and O$_2$. Second trench T2 having second side surface S2 continuous to first main surface 10a of silicon carbide substrate 10 and second bottom portion B2 continuous to second side surface S2 is thus formed. Source region 14 and base region 13 are exposed at second side surface S2 of second trench T2 and base region 13 is exposed at second bottom portion B2 of second trench T2. As above, second trench T2 having second side surface S2 in contact with source region 14 and base region 13 and second bottom portion B2 in contact with base region 13 is formed.

Figure 12:
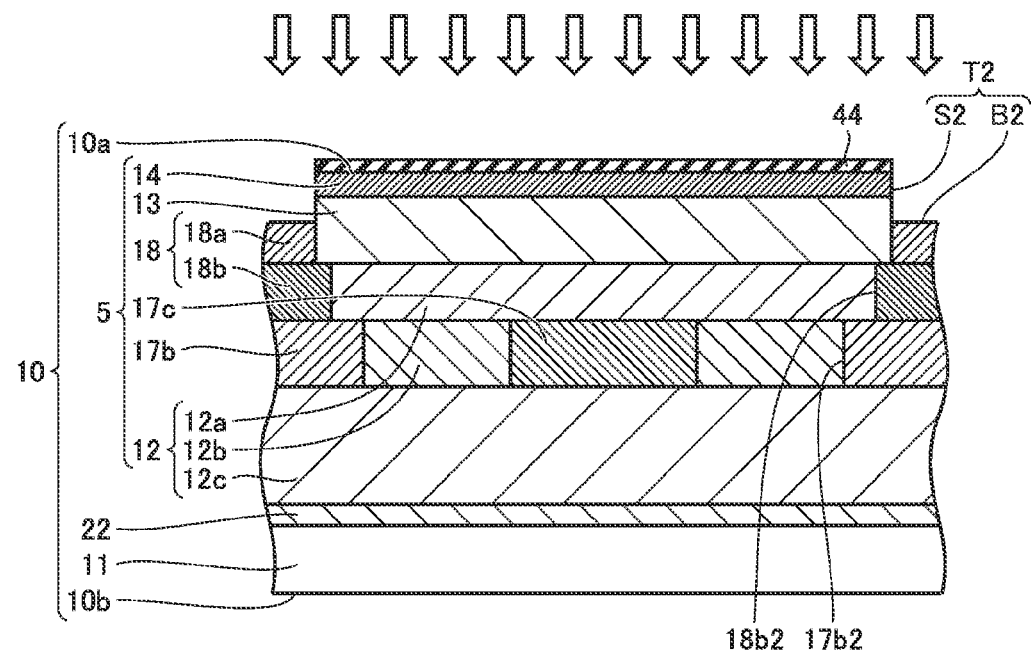
FIG. 12 is a schematic cross-sectional view for schematically illustrating a ninth step in the method for manufacturing the silicon carbide semiconductor device according to the first embodiment of the present invention.

Then, a third p-type impurity ion implanting step (S80: FIG. 3) is performed. Specifically, ions are implanted into base region 13 in silicon carbide epitaxial layer 5 by using mask 44. Referring to FIG. 12, for example, aluminum ions are implanted into second bottom portion B2 of second trench T2 to a depth reaching third region 18b along the direction perpendicular to second bottom portion B2 of second trench T2 as shown with an arrow. Thus, fourth region 18a which is in contact with base region 13, is formed to connect second bottom portion B2 of second trench T2 and third region 18b to each other, and has the p conductivity type is formed. Third region 18b and fourth region 18a constitute second region 18. As above, fourth region 18a is formed as a result of implantation of ions into second bottom portion B2 of second trench T2.

Then, an activation annealing step is performed. After mask 44 is removed from first main surface 10a of silicon carbide substrate 10, first main surface 10a of silicon carbide substrate 10 and second side surface S2 and second bottom portion B2 of second trench T2 are covered with a protecting film. Then, silicon carbide substrate 10 is heated in an argon atmosphere at a temperature, for example, not lower than 1600° C. and not higher than 1750° C. approximately for a period not shorter than 5 minutes and not longer than 30 minutes. Thus, the p-type impurity such as aluminum contained in base region 13, the n-type impurity such as phosphorus contained in source region 14, the n-type impurity such as nitrogen contained in second drift region 12b, and the p-type impurity such as aluminum contained in fourth impurity region 17 are activated.

Figure 13:
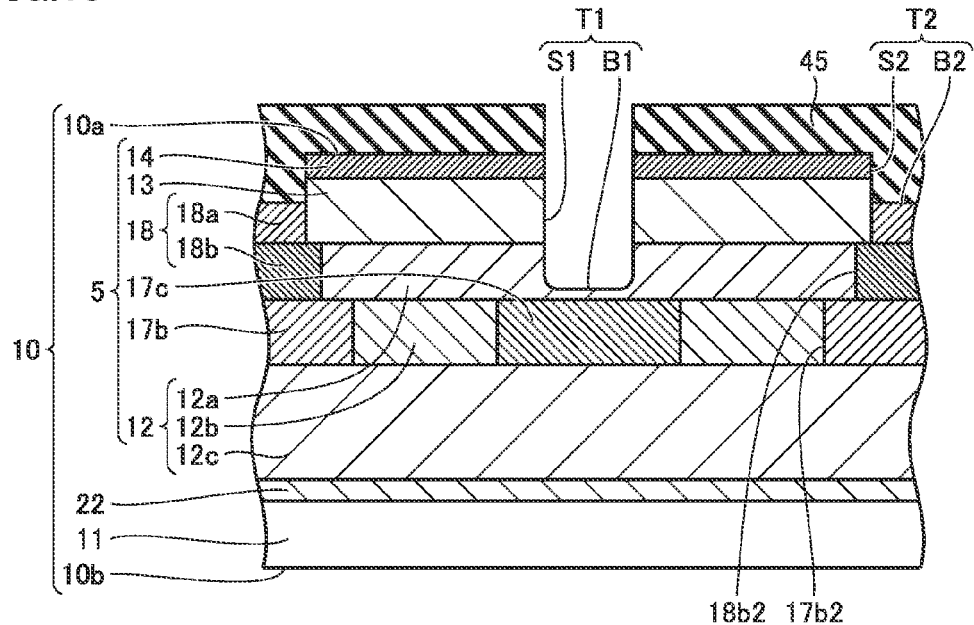
FIG. 13 is a schematic cross-sectional view for schematically illustrating a tenth step in the method for manufacturing the silicon carbide semiconductor device according to the first embodiment of the present invention.

Then, a gate trench forming step (S90: FIG. 3) is performed. Referring to FIG. 13, an etching mask 45 is formed on source region 14 and fourth region 18a. Etching mask 45 is composed of a material including, for example, a TEOS oxide film, and etching mask 45 has a thickness, for example, of 1.6 μm. Then, an opening is provided in etching mask 45 as a result of RF etching with CHF$_3$ and O$_2$ of etching mask 44 over a region where first trench T1 is to be provided. Then, silicon carbide substrate 10 is etched by using etching mask 45 having the opening provided over a region where first trench T1 is to be formed. For example, silicon carbide substrate 10 is subjected to ECR plasma etching with SF$_6$ and O$_2$. Thus, first trench T1 having first side surface S1 continuous to first main surface 10a of silicon carbide substrate 10 and first bottom portion B1 continuous to first side surface S1 is formed. Source region 14, base region 13, and first drift region 12a are exposed at first side surface S1 of first trench T1 and first drift region 12a is exposed at first bottom portion B1 of first trench T1. First trench T1 has a depth, for example, not smaller than 0.5 μm and not greater than 2.3 μm. First trench T1 has a width, for example, not smaller than 0.5 μm and not greater than 3 μm. Preferably, first trench T1 is greater in depth than second trench T2.

As above, silicon carbide substrate 10 having first main surface 10a and second main surface 10b opposite to first main surface 10a is prepared. Silicon carbide substrate 10 includes drift region 12 having the n-type, base region 13 which is in contact with drift region 12 and has the p-type different from the n-type, source region 14 which has the n-type and is spaced apart from drift region 12 by base region 13, and fourth impurity region 17 which has the p-type and is higher in impurity concentration than base region 13. In first main surface 10a of silicon carbide substrate 10, first trench T1 having first side surface S1 and first bottom portion B1 is formed, first side surface S1 continuous to first main surface 10a and being in contact with source region 14, base region 13, and drift region 12, first bottom portion B1 continuous to first side surface S1. In first main surface 10a, second trench T2 having second side surface S2 and second bottom portion B2 is formed, second side surface S2 continuous to first main surface 10a and being in contact with source region 14 and base region 13, second bottom portion B2 continuous to second side surface S2. Fourth impurity region 17 includes first region 17b arranged between second main surface 10b and base region 13 and second region 18 connecting second bottom portion B2 of second trench T2 and first region 17b to each other. Side surface 18b2 of third region 18b is provided to retract toward the side opposite to first side surface S1 of first trench T1 relative to side surface 17b2 of first region 17b. Second region 18 has third region 18b in contact with drift region 12 and first region 17b and fourth region 18a which passes through base region 13 and connects second bottom portion B2 of second trench T2 and third region 18b to each other.

Figure 14:
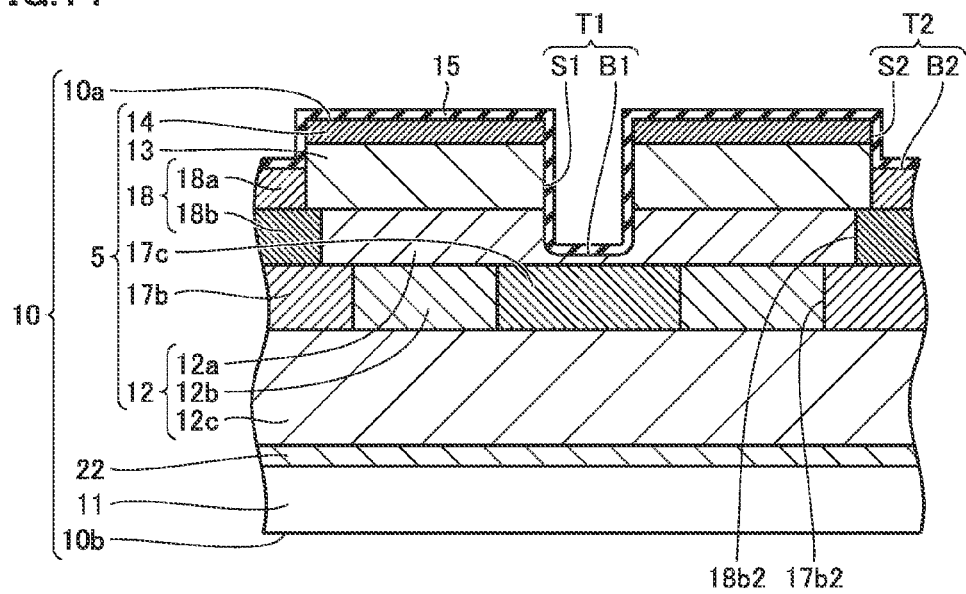
FIG. 14 is a schematic cross-sectional view for schematically illustrating an eleventh step in the method for manufacturing the silicon carbide semiconductor device according to the first embodiment of the present invention.

Then, a gate insulating film forming step (S100: FIG. 3) is performed. Specifically, after mask 45 is removed, silicon carbide substrate 10 having first trench T1 provided in first main surface 10a is arranged in a heating furnace. By introducing oxygen into the heating furnace and dry oxidizing silicon carbide substrate 10 at a temperature, for example, not lower than 1100° C. and not higher than 1300° C., gate insulating film 15 in contact with first side surface S1 and first bottom portion B1 of first trench T1 is formed (see FIG. 14). Gate insulating film 15 is in contact with first drift region 12a, base region 13, and source region 14 at first side surface S1 of first trench T1 and is in contact with first drift region 12a at first bottom portion B1 of first trench T1. Gate insulating film 15 is in contact with source region 14 at first main surface 10a, in contact with source region 14 and base region 13 at second side surface S2 of second trench T2, and in contact with fourth region 18a at second bottom portion B2 of second trench T2. Gate insulating film 15 has a thickness, for example, not smaller than 50 nm and not greater than 150 nm. Gate insulating film 15 may be a deposited oxide film.

Then, an NO annealing step is performed. Specifically, silicon carbide substrate 10 having gate insulating film 15 formed on first main surface 10a is subjected to heat treatment at a temperature, for example, not lower than 1100° C. and not higher than 1300° C. in an atmosphere containing nitrogen. Examples of a gas containing nitrogen include, for example, nitrous oxide diluted by 10% with nitrogen. Preferably, silicon carbide substrate 10 having gate insulating film 15 formed is held in the gas containing nitrogen, for example, for a period not shorter than 30 minutes and not longer than 360 minutes.

Then, a gate electrode forming step (S110: FIG. 3) is performed. Specifically, gate electrode 27 is formed on gate insulating film 15 so as to bury a groove defined by gate insulating film 15. Gate electrode 27 is composed, for example, of a material containing polysilicon containing an impurity. Then, interlayer insulating film 21 is formed to cover gate electrode 27. Interlayer insulating film 21 includes, for example, a TEOS oxide film and PSG.

Then, a source electrode forming step (S120: FIG. 3) is performed. Specifically, as a result of removal of interlayer insulating film 21 and gate insulating film 15 in a region where source electrode 16 is to be formed, each of source region 14, base region 13, and fourth region 18a is exposed through interlayer insulating film 21. Then, source electrode 16 is formed, for example, through sputtering so as to be in contact with source region 14 at first main surface 10a of silicon carbide substrate 10, in contact with base region 13 and source region 14 at second side surface S2 of second trench T2, and in contact with fourth region 18a at second bottom portion B2 of second trench T2. Source electrode 16 contains, for example, Ni and Ti. Source electrode 16 may be composed of a material containing TiAlSi. Then, silicon carbide substrate 10 having source electrode 16 formed, source electrode 16 being in contact with source region 14 on the side of first main surface 10a, is subjected to rapid thermal anneal (RTA) for approximately 2 minutes, for example, at a temperature not lower than 900° C. and not higher than 1100° C. Thus, at least a part of source electrode 16 reacts with silicon contained in the silicon carbide substrate and silicided. Thus, source electrode 16 in ohmic contact with source region 14 is formed. Preferably, source electrode 16 is in ohmic contact with each of source region 14 and fourth region 18a. As above, source electrode 16 electrically connected to source region 14 on the side of first main surface 10a is formed. Seventh region 17c of fourth impurity region 17 faces first bottom portion B1 of first trench T1 and is electrically connected to source electrode 16. First region 17b and second region 18 of fourth impurity region 17 are electrically connected to source electrode 16.

Referring to FIG. 1, source interconnection 19 is formed to be in contact with source electrode 16 in the inside of second trench T2 and to cover interlayer insulating film 21. Source interconnection 19 is preferably composed of a material containing Al and composed, for example, of a material containing AlSiCu. Then, protecting film 24 is formed to cover source interconnection 19. Protecting film 24 is composed, for example, of a material including a nitride film and polyimide.

Then, a drain electrode forming step (S130: FIG. 3) is performed. Specifically, drain electrode 20 composed, for example, of NiSi is formed as being in contact with second main surface 10b of silicon carbide substrate 10. Drain electrode 20 may be composed, for example, of TiAlSi. Drain electrode 20 is formed, for example, through sputtering, however, it may be formed through vapor deposition. After drain electrode 20 is formed, drain electrode 20 is heated, for example, through laser annealing. Thus, at least a part of drain electrode 20 is silicided and comes in ohmic contact with silicon carbide single-crystal substrate 11, so that drain electrode 20 electrically connected to third drift region 12c on the side of second main surface 10b is formed. MOSFET 1 shown in FIG. 1 is manufactured as above.

A function and effect of MOSFET 1 as the silicon carbide semiconductor device and the method for manufacturing the same according to the first embodiment will now be described.

According to MOSFET 1 according to the first embodiment, source electrode 16 is electrically connected to source region 14 on the side of first main surface 10a and in contact with second region 18 at second bottom portion B2 of second trench T2. Since first electrode 16 is thus formed in proximity to first region 17b, a resistance between source electrode 16 and first region 17b can be lowered. Since first region 17b can consequently be fixed in potential to source electrode 16 in a stable manner, MOSFET 1 fast in response can be obtained. Since first region 17b is arranged between second main surface 10b and base region 13, application of high electric field to base region 13 can be suppressed. Therefore, MOSFET 1 fast in response and high in reliability can be obtained.

According to MOSFET 1 according to the first embodiment, second region 18 has third region 18b in contact with drift region 12 and first region 17b and fourth region 18a which passes through base region 13 and connects second bottom portion B2 of second trench T2 and third region 18b to each other. Thus, first region 17b can effectively be fixed in potential to source electrode 16.

According to MOSFET 1 according to the first embodiment, side surface 18b2 of third region 18b is provided to retract toward the side opposite to first side surface S1 of first trench T1 relative to side surface 17b2 of first region 17b. Thus, electric field is once narrowed by first region 17b and then electric field is spread by third region 18b in the direction in parallel to first main surface 10a so that intensity of electric field applied to base region 13 can be reduced.

According to MOSFET 1 according to the first embodiment, fourth impurity region 17 further has seventh region 17c which faces first bottom portion B1 of first trench T1 and is electrically connected to source electrode 16. Since concentration of electric field at first bottom portion B1 of first trench T1 can thus be relaxed, MOSFET 1 higher in reliability can be obtained.

According to MOSFET 1 according to the first embodiment, fourth impurity region 17 further includes eighth region 17d which connects a part of one side in the direction of the major axis of first region 17b and a part of one side in the direction of the major axis of seventh region 17c to each other when viewed in the direction perpendicular to second main surface 10b. Second bottom portion B2 of second trench T2 is located on a region where first region 17b and eighth region 17d intersect with each other. Since both of first region 17b and seventh region 17c can effectively be connected to source electrode 16, a switching speed can be improved.

According to MOSFET 1 according to the first embodiment, a width of first bottom portion B1 in the direction of the major axis of first bottom portion B1 of first trench T1 is longer than a width of second bottom portion B2 of second trench T2 in the direction of the major axis of first bottom portion B1 when viewed in the direction perpendicular to second main surface 10b. A characteristic on-resistance can thus be lowered.

According to the method for manufacturing MOSFET 1 according to the first embodiment, source electrode 16 is electrically connected to source region 14 on the side of first main surface 10a and in contact with second region 18 at second bottom portion B2 of second trench T2. Since source electrode 16 is thus formed in proximity to first region 17b, a resistance between source electrode 16 and first region 17b can be lowered. Since first region 17b can consequently be fixed in potential to source electrode 16 in a stable manner, MOSFET 1 fast in response can be obtained. Since first region 17b is arranged between second main surface 10b and base region 13, application of high electric field to base region 13 can be suppressed. Therefore, MOSFET 1 fast in response and high in reliability can be obtained.

According to the method for manufacturing MOSFET 1 according to the first embodiment, second region 18 has third region 18b in contact with drift region 12 and first region 17b and fourth region 18a which passes through base region 13 and connects second bottom portion B2 of second trench T2 and third region 18b to each other. Forming silicon carbide substrate 10 includes forming first portion 12c of drift region 12 through epitaxial growth, forming first region 17b by implanting ions into first portion 12c of drift region 12, forming second portion 12a of drift region 12 on first portion 12c of drift region 12 and first region 17b through epitaxial growth, forming third region 18b by implanting ions into second portion 12a of the drift region, forming base region 13 on third region 18b and second portion 12a through epitaxial growth, forming source region 14 by implanting ions into base region 13, forming second trench T2 having second side surface S2 in contact with source region 14 and base region 13 and second bottom portion B2 in contact with base region 13, and forming fourth region 18a by implanting ions into second bottom portion B2 of second trench T2. Since ions are implanted into second bottom portion B2 of second trench T2 after second trench T2 is formed, ions can be implanted deep into silicon carbide substrate 10 with relatively low ion implantation energy. Therefore, load imposed in an ion implanting step can be reduced.

According to the method for manufacturing MOSFET 1 according to the first embodiment, side surface 18b2 of third region 18b is provided to retract toward the side opposite to first side surface S1 of first trench T1 relative to side surface 17b2 of first region 17b. Thus, electric field is once narrowed by first region 17b and then electric field is spread by third region 18b in the direction in parallel to first main surface 10a so that intensity of electric field applied to second impurity region 13 can be reduced.

According to the method for manufacturing MOSFET 1 according to the first embodiment, fourth impurity region 17 further has seventh region 17c which faces first bottom portion B1 of first trench T1 and is electrically connected to source electrode 16. Since concentration of electric field at first bottom portion B1 of first trench T1 can thus be relaxed, MOSFET 1 higher in reliability can be obtained.

According to the method for manufacturing MOSFET 1 according to the first embodiment, second region 18 has third region 18b in contact with drift region 12 and first region 17b and fourth region 18a which passes through base region 13 and connects second bottom portion B2 of second trench T2 and third region 18b to each other. Forming silicon carbide substrate 10 includes forming first portion 12c of drift region 12 through epitaxial growth, forming first region 17b, second portion 12a of drift region 12 located on first portion 12c of drift region 12 and first region 17b, and third region 18b by implanting ions into first portion 12c of drift region 12, forming base region 13 on third region 18b and second portion 12a through epitaxial growth, forming source region 14 by implanting ions into base region 13, forming second trench T2 having second side surface S2 in contact with source region 14 and base region 13 and second bottom portion B2 in contact with base region 13, and forming fourth region 18a by implanting ions into second bottom portion B2 of second trench T2. A resistance between first electrode 16 and first region 17b can thus be lowered. Since first region 17b can be fixed in potential to first electrode 16 in a stable manner, MOSFET 1 fast in response can be obtained.

(Second Embodiment)

A construction of a MOSFET as a silicon carbide semiconductor device according to a second embodiment of the present invention will now be described. The MOSFET according to the second embodiment is different from the MOSFET according to the first embodiment in that side surface 18b2 of third region 18b is provided to protrude toward first side surface S1 of first trench T1 relative to side surface 17b2 of first region 17b, and other features are substantially the same as those of the MOSFET according to the first embodiment. Therefore, the same or corresponding elements have the same reference characters allotted and description thereof will not be repeated.

Figure 16:
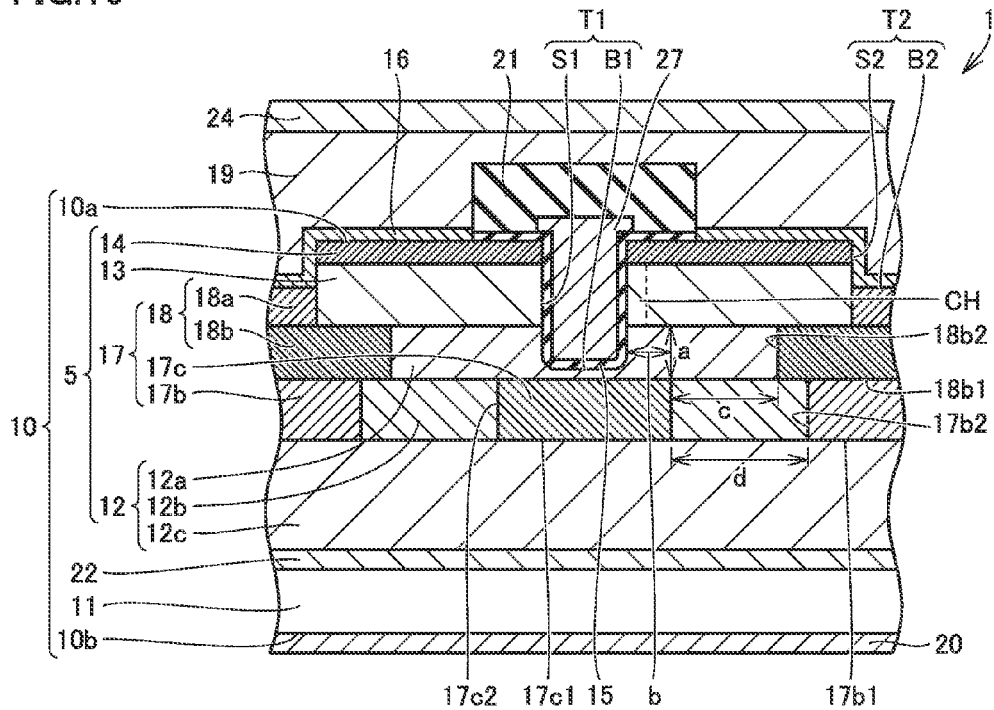
FIG. 16 is a schematic cross-sectional view for schematically illustrating a structure of a silicon carbide semiconductor device according to a second embodiment of the present invention.

Referring to FIG. 16, side surface 17a2 of third region 18b in fourth impurity region 17 is provided to protrude toward first side surface S1 of first trench T1 relative to side surface 17b2 of first region 17b. In this case, third region 18b is in contact with second drift region 12b. Third region 18b is provided as lying between base region 13 and second drift region 12*b* in the direction perpendicular to second main surface 10*b*. Distance c between side surface 17*c*2 of seventh region 17*c* and side surface 18*b*2 of third region 18*b* in the direction in parallel to second main surface 10*b* is shorter than distance d between side surface 17*c*2 of seventh region 17*c* and side surface 17*b*2 of first region 17*b*.

In the MOSFET according to the second embodiment, in the second p-type impurity ion implanting step (S50: FIG. 3) in the first embodiment, ions of a p-type impurity such as aluminum are implanted into first drift region 12*a* through an ion implantation mask having a width of an opening greater than first region 17*b*, so that third region 18*b* is formed. Thus, third region 18*b* of which side surface 18*b*2 protrudes toward first side surface S1 of first trench T1 relative to side surface 17*b*2 of first region 17*b* is formed. Other steps are substantially the same as those in the method for manufacturing the MOSFET in the first embodiment.

A function and effect of MOSFET 1 as the silicon carbide semiconductor device according to the second embodiment will now be described.

According to MOSFET 1 according to the second embodiment, side surface 18*b*2 of third region 18*b* is provided to protrude toward first side surface S1 of first trench T1 relative to side surface 17*b*2 of first region 17*b*. Thus, electric field is once narrowed by first region 17*b* and then electric field is further narrowed by third region 18*b*, so that high electric field can be prevented from being directly applied to base region 13.

According to the method for manufacturing MOSFET 1 according to the second embodiment, side surface 18*b*2 of third region 18*b* is provided to protrude toward first side surface S1 of first trench T1 relative to side surface 17*b*2 of first region 17*b*. Thus, electric field is once narrowed by first region 17*b* and then electric field is further narrowed by third region 18*b*, so that high electric field can be prevented from being directly applied to base region 13.

(Third Embodiment)

A construction of a MOSFET as a silicon carbide semiconductor device according to a third embodiment of the present invention will now be described. The MOSFET according to the third embodiment is different from the MOSFET according to the first embodiment in that first bottom portion B1 of first trench T1 is in contact with seventh region 17*c*, and other features are substantially the same as those of the MOSFET according to the first embodiment. Therefore, the same or corresponding elements have the same reference characters allotted and description thereof will not be repeated.

Figure 17:
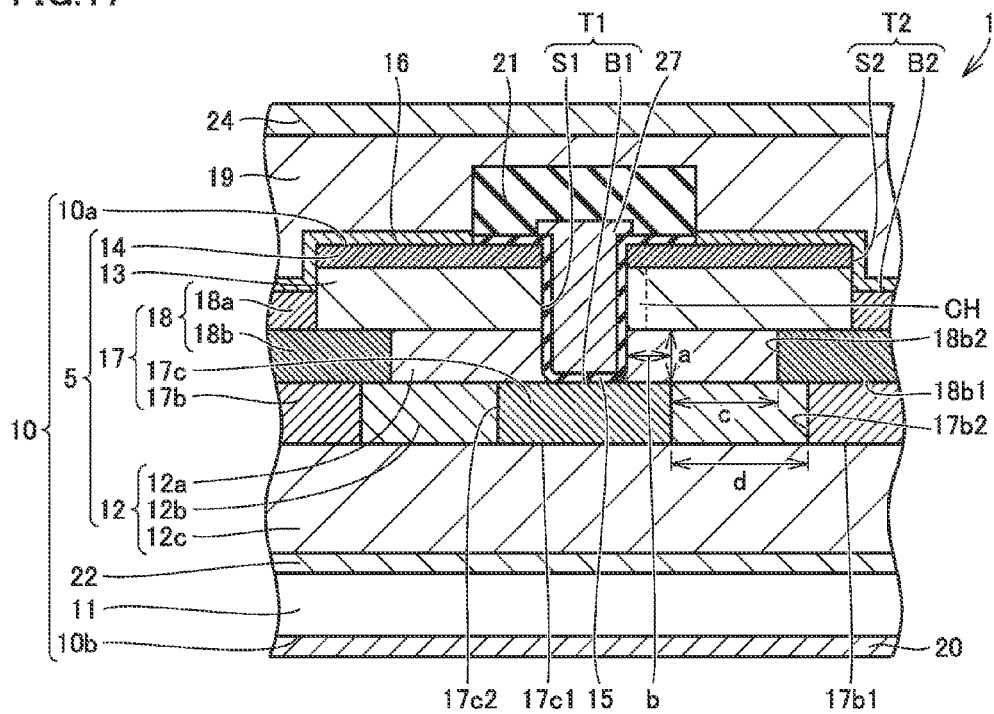
FIG. 17 is a schematic cross-sectional view for schematically illustrating a structure of a silicon carbide semiconductor device according to a third embodiment of the present invention.

Referring to FIG. 17, first bottom portion B1 of first trench T1 is in contact with seventh region 17*c*. First trench T1 may reach seventh region 17*c*, for example, through first drift region 12*a*. First drift region 12*a* does not have to be provided between first bottom portion B1 of first trench T1 and seventh region 17*c*. First bottom portion B1 of first trench T1 may be located flush with a boundary surface between third region 18*b* and first region 17*b*. As a result of contact of seventh region 17*c* with first bottom portion B1 of first trench T1, concentration of electric field at first bottom portion B1 of first trench T1 can effectively be relaxed.

(Fourth Embodiment)

A construction of a MOSFET as a silicon carbide semiconductor device according to a fourth embodiment of the present invention will now be described. The MOSFET according to the fourth embodiment is different from the MOSFET according to the first embodiment in that third trench T3 having third side surface S3 continuous to second bottom portion B2 and third bottom portion B3 continuous to third side surface S3 is provided in second bottom portion B2 of second trench T2, and other features are substantially the same as those of the MOSFET according to the first embodiment. Therefore, the same or corresponding elements have the same reference characters allotted and description thereof will not be repeated.

Figure 18:
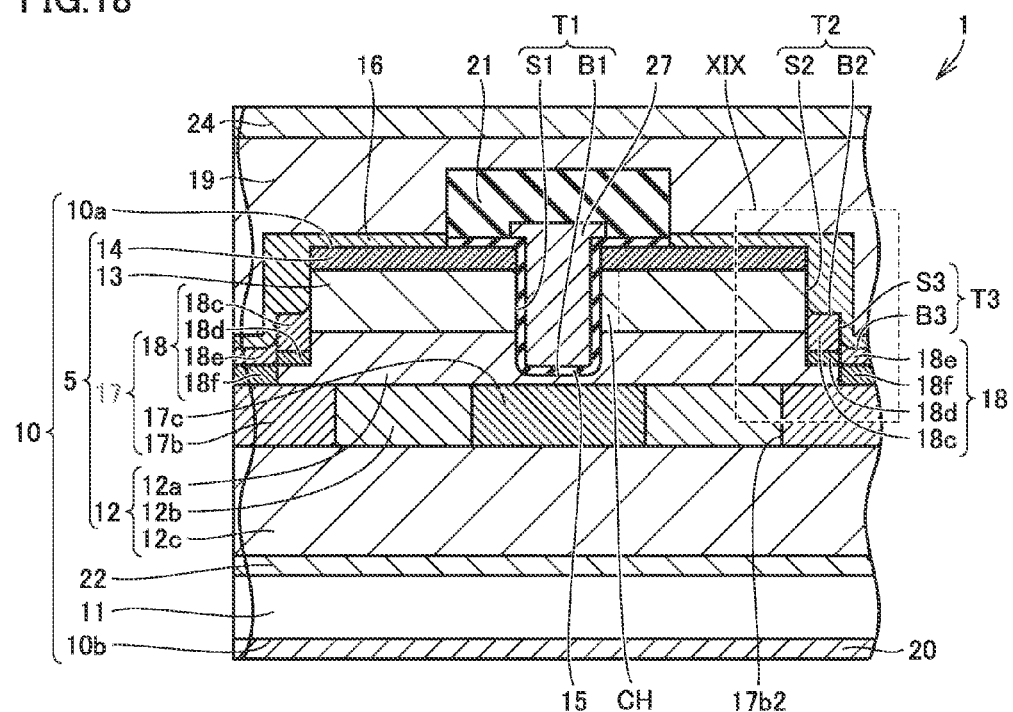
FIG. 18 is a schematic cross-sectional view for schematically illustrating a structure of a silicon carbide semiconductor device according to a fourth embodiment of the present invention.
Figure 19:
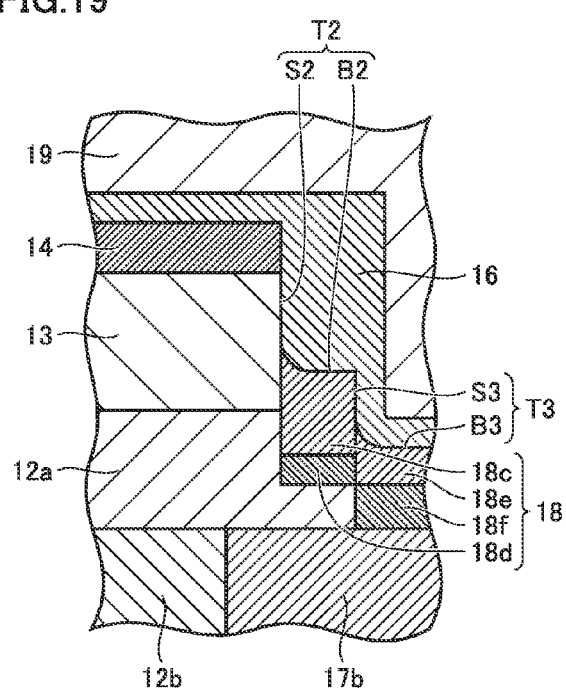
FIG. 19 is an enlarged view of a region XIX in FIG. 18.

Referring to FIGS. 18 and 19, third trench T3 having third side surface S3 continuous to second bottom portion B2 and third bottom portion B3 continuous to third side surface S3 is provided in second bottom portion B2 of second trench T2. Source electrode 16 is in contact with second region 18 at third side surface S3 of third trench T3 and in contact with second region 18 at third bottom portion B3 of third trench T3. Second region 18 is in contact with base region 13, and in contact with second bottom portion B2 of second trench T2, third side surface S3 of third trench T3, and third bottom portion B3 of third trench T3. Second region 18 has a fifth region 18*c*, a sixth region 18*f*, a ninth region 18*d*, and a tenth region 18*e*. Fifth region 18*c* is in contact with third side surface S3 of third trench T3 and second bottom portion B2 of second trench T2. In other words, fifth region 18*c* is in contact with source electrode 16 at third side surface S3 of third trench T3 and in contact with source electrode 16 at second bottom portion B2 of second trench T2. Fifth region 18*c* may be in contact with base region 13 and first drift region 12*a*.

Sixth region 18*f* is in contact with first region 17*b* and electrically connected to fifth region 18*c*. Sixth region 18*f* may be lower in concentration of a p-type impurity than fifth region 18*c*. Sixth region 18*f* lies between tenth region 18*e* and first region 17*b* in the direction perpendicular to second main surface 10*b*. Sixth region 18*f* may be in contact with first drift region 12*a*. Ninth region 18*d* lies between fifth region 18*c* and first drift region 12*a* in the direction perpendicular to second main surface 10*b* and lies between first drift region 12*a* and tenth region 18*e* in the direction in parallel to second main surface 10*b*. Ninth region 18*d* may be lower in concentration of a p-type impurity than each of fifth region 18*c* and tenth region 18*e*. Tenth region 18*e* is in contact with source electrode 16 at third bottom portion B3 of third trench T3. Tenth region 18*e* lies between third bottom portion B3 of third trench T3 and sixth region 18*f* in the direction perpendicular to second main surface 10*b*. Tenth region 18*e* may be higher in concentration of a p-type impurity than sixth region 18*f*. Tenth region 18*e* may be in contact with fifth region 18*c* and ninth region 18*d*.

A method for manufacturing MOSFET 1 as the silicon carbide semiconductor device according to the fourth embodiment will now be described.

Referring to FIGS. 4 to 8, the first n-type epitaxial layer forming step (S10: FIG. 3), the first p-type impurity ion implanting step (S20: FIG. 3), the first n-type impurity ion implanting step (S30: FIG. 3), and the second n-type epitaxial layer forming step (S40: FIG. 3) described in the first embodiment are performed.

Specifically, silicon carbide single-crystal substrate 11 is prepared, for example, by cutting a substrate by slicing a silicon carbide single-crystal ingot grown with the improved Raleigh method and mirror polishing a surface of the substrate (see FIG. 4). Then, for example, a carrier gas containing hydrogen, a source material gas containing silane and propane, and a dopant gas containing nitrogen are supplied over silicon carbide single-crystal substrate 11, and silicon carbide single-crystal substrate 11 is heated, for example, to a temperature around 1550° C. under a pressure of 100 mbar (10 kPa). Thus, a silicon carbide epitaxial layer having the n-type is formed on silicon carbide single-crystal substrate 11. Third drift region 12c of drift region 12 is formed through epitaxial growth (see FIG. 5). Then, ion implantation mask 41 having a through mask is formed on third drift region 12c of silicon carbide epitaxial layer 5 (see FIG. 6). Then, using ion implantation mask 41 having the through film, ions are implanted into third drift region 12c in silicon carbide epitaxial layer 5. For example, aluminum (Al) ions are implanted into third drift region 12c through the through film in a direction shown with an arrow, so that seventh region 17c and first region 17b having the p-type and being higher in impurity concentration than base region 13 are formed (see FIG. 7). Then, after ion implantation mask 41 is removed. for example, through film 42 having a thickness of 80 nm is formed as being in contact with seventh region 17c, first region 17b, and third drift region 12c. Then, for example, nitrogen ions are implanted into seventh region 17c, first region 17b, and third drift region 12c from above through film 42 in a direction shown with an arrow. Thus, in a cross-sectional view, second drift region 12b having the n-type and being higher in impurity concentration than third drift region 12c is formed in a region lying between seventh region 17c and first region 17b (see FIG. 8).

Figure 20:
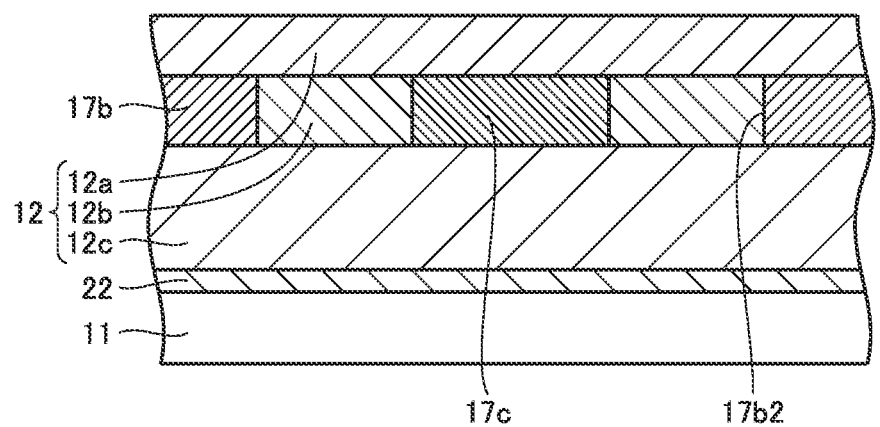
FIG. 20 is a schematic cross-sectional view for schematically illustrating a first step in the method for manufacturing the silicon carbide semiconductor device according to the fourth embodiment of the present invention.

Then, the second n-type epitaxial layer forming step (S40: FIG. 3) is performed. Specifically, first drift region 12a is formed through epitaxial growth while doping with an n-type impurity such as nitrogen is performed. A concentration of an n-type impurity such as nitrogen contained in first drift region 12a is, for example, not lower than $1 \times 10^{16}$ cm$^{-3}$ and not higher than $7 \times 10^{16}$ cm$^{-3}$. First drift region 12a is formed as being in contact with seventh region 17c, first region 17b, and second drift region 12b. First drift region 12a has a thickness, for example, not smaller than 0.3 µm and not greater than 1.0 µm. As above, first drift region 12a of drift region 12 is formed on the first portion (a portion constituted of third drift region 12c and second drift region 12b) and first region 17b through epitaxial growth (see FIG. 20). Instead of forming first drift region 12a through epitaxial growth, first drift region 12a may be formed, for example, by implanting ions of an n-type impurity such as nitrogen or phosphorus into a silicon carbide epitaxial region such as third drift region 12c. First region 17b, first drift region 12a located on third drift region 12 and first region 17b, and third region 18b may be formed as a result of implantation of ions into third drift region 12c.

Figure 21:
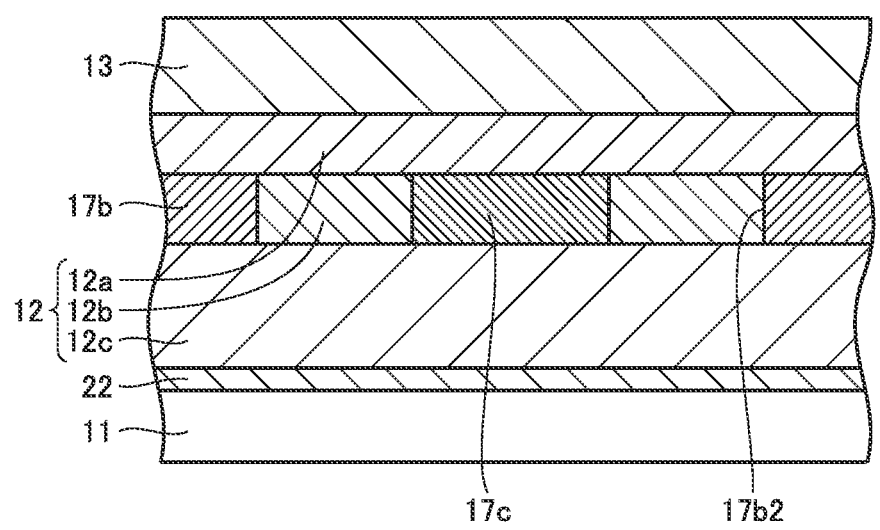
FIG. 21 is a schematic cross-sectional view for schematically illustrating a second step in the method for manufacturing the silicon carbide semiconductor device according to the fourth embodiment of the present invention.

Then, the p-type epitaxial layer forming step (S60: FIG. 3) is performed. Base region 13 is formed on first drift region 12a through epitaxial growth without implantation of ions of a p-type impurity into first drift region 12a. Specifically, base region 13 is formed through epitaxial growth while doping with a p-type impurity such as aluminum is performed. A concentration of a p-type impurity such as aluminum contained in base region 13 is, for example, not lower than $5 \times 10^{15}$ cm$^{-3}$ and not higher than $1 \times 10^{17}$ cm$^{-3}$. Base region 13 is formed to be in contact with both of third region 18b and first drift region 12a (see FIG. 21). Base region 13 has a thickness, for example, not smaller than 0.5 µm and not greater than 1.5 µm.

Base region 13 may be formed by implanting ions of a p-type impurity such as aluminum into a part of first drift region 12a through a surface of first drift region 12a formed in the second n-type epitaxial layer forming step (S40: FIG. 3), instead of performing the p-type epitaxial layer forming step (S60: FIG. 3). In this case, ions are implanted into first drift region 12a such that first drift region 12a remains as being in contact with a lower end surface of base region 13.

Then, the third n-type impurity ion implanting step (S70: FIG. 3) is performed. Specifically, ions are implanted into base region 13 in silicon carbide epitaxial layer 5. As a result of implantation of ions of an n-type impurity such as phosphorus into base region 13 in silicon carbide epitaxial layer 5 in a direction shown with an arrow, source region 14 having the n-type is formed. Ions of an n-type impurity may be implanted by using through film 43 formed on base region 13.

Then, a second trench forming step is performed. Mask 44 having an opening over a region where second trench T2 is to be formed is formed. Then, silicon carbide substrate 10 is etched by using mask 44. For example, silicon carbide substrate 10 is subjected to ECR plasma etching with SF$_6$ and O$_2$. Thus, second trench T2 having second side surface S2 continuous to first main surface 10a of silicon carbide substrate 10 and second bottom portion B2 continuous to second side surface S2 is formed. Source region 14 and base region 13 are exposed at second side surface S2 of second trench T2 and base region 13 is exposed at second bottom portion B2 of second trench T2. As above, second trench T2 having second side surface S2 in contact with source region 14 and base region 13 and second bottom portion B2 in contact with base region 13 is formed.

Figure 22:
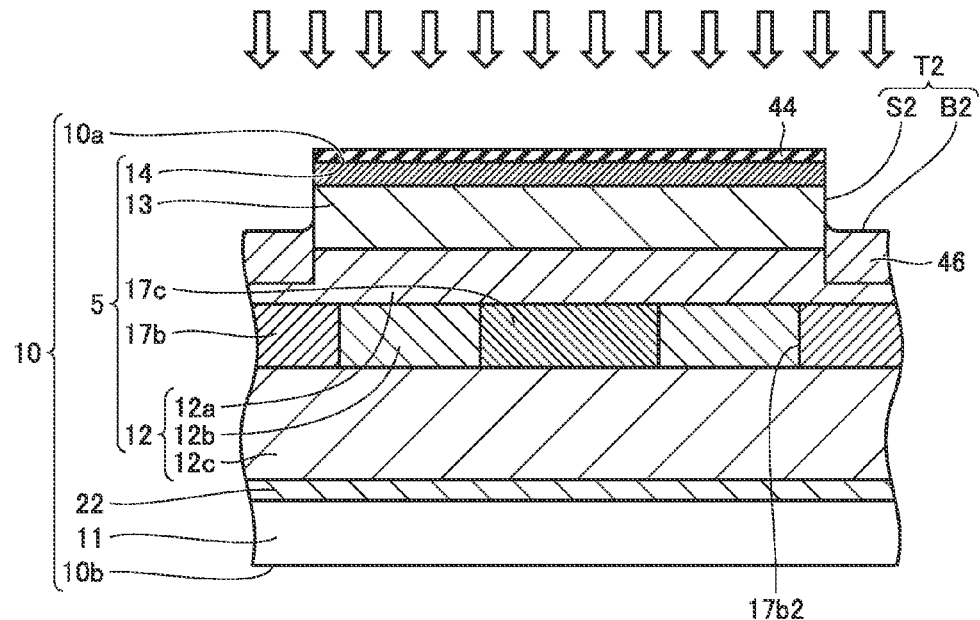
FIG. 22 is a schematic cross-sectional view for schematically illustrating a third step in the method for manufacturing the silicon carbide semiconductor device according to the fourth embodiment of the present invention.

Then, the third p-type impurity ion implanting step (S80: FIG. 3) is performed. Specifically, ions are implanted into base region 13 in silicon carbide epitaxial layer 5 by using mask 44. Referring to FIG. 22, for example, aluminum ions are implanted into each of base region 13 and first drift region 12a in the direction perpendicular to second bottom portion B2 of second trench T2 as shown with an arrow. By implanting ions into second bottom portion B2 of second trench T2, third portion 46 having the p-type and being in contact with first drift region 12a while third portion 46 is spaced apart from first region 17b is formed. Third portion 46 is in contact with each of base region 13 and first drift region 12a at the side surface of third portion 46 and a bottom surface of third portion 46 is formed as facing first region 17b.

Then, a third trench forming step is performed. A mask having an opening over a region where third trench T3 is to be formed is formed and silicon carbide substrate 10 is etched by using the mask. For example, silicon carbide substrate 10 is subjected to ECR plasma etching with SF$_6$ and O$_2$. Thus, third trench T3 having third side surface S3 continuous to second bottom portion B2 of second trench T2 and being in contact with third portion 46 and third bottom portion B3 continuous to third side surface S3 is formed.

Figure 23:
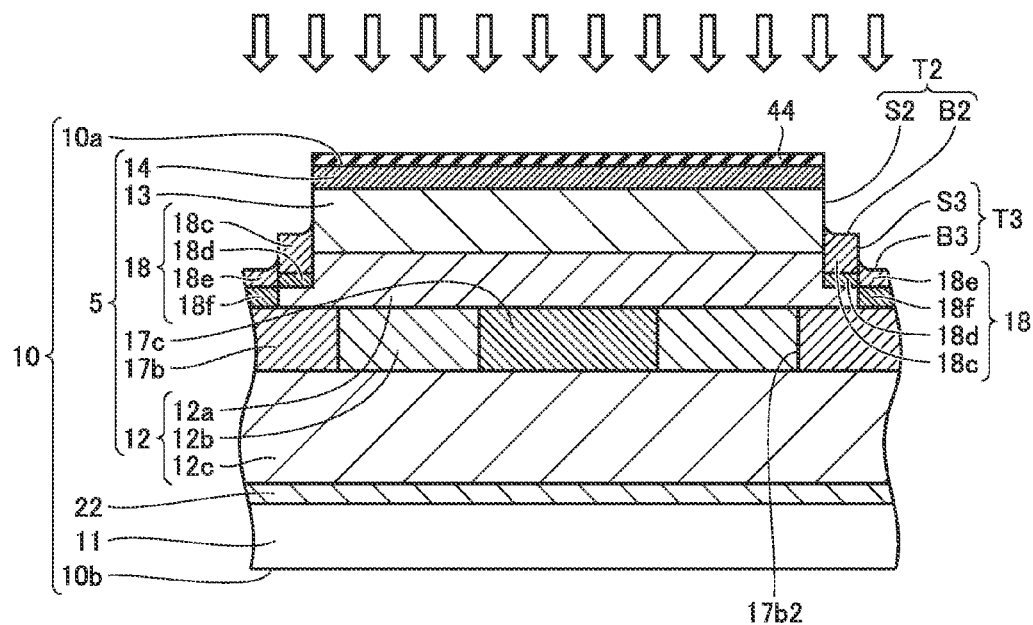
FIG. 23 is a schematic cross-sectional view for schematically illustrating a fourth step in the method for manufacturing the silicon carbide semiconductor device according to the fourth embodiment of the present invention.

Then, a fourth p-type impurity implanting step is performed. Specifically, ions are implanted into third portion 46 in silicon carbide epitaxial layer 5 by using mask 44. Referring to FIG. 23, for example, aluminum ions are implanted into third portion 46 along the direction perpendicular to second bottom portion B2 of second trench T2 and third bottom portion B3 of third trench T3 as shown with an arrow. By implanting ions into second bottom portion B2 of second trench T2, fifth region 18c and ninth region 18d are formed. By implanting ions into third bottom portion B3 of third trench T3, for example, aluminum ions are introduced into each of third portion 46 and first drift region 12a. Thus, sixth region 18f having the p-type and connecting third portion 46 and first region 17b to each other is formed. Consequently, second region 18 connecting second bottom portion B2 of second trench T2 and first region 17b to each other is formed. Ions may be implanted only into third bottom portion B3 of third trench T3. Sixth region 18f electrically connected to third region 46 may be formed.

A function and effect of MOSFET 1 as the silicon carbide semiconductor device according to the fourth embodiment will now be described.

According to MOSFET 1 according to the fourth embodiment, third trench T3 having third side surface S3 continuous to second bottom portion B2 and third bottom portion B3 continuous to third side surface S3 is provided in second bottom portion B2 of second trench T2. Second region 18 has fifth region 18c in contact with third side surface S3 of third trench T3 and second bottom portion B2 of second trench T2 and sixth region 18f being in contact with first region 17b and electrically connected to fifth region 18c. Occurrence of punch through between source region 14 and drift region 12 can be suppressed by fifth region 18c in contact with each of third side surface S3 of third trench T3 and second bottom portion B2 of second trench T2.

According to the method for manufacturing MOSFET 1 according to the fourth embodiment, forming silicon carbide substrate 10 includes forming first portion 12c of drift region 12 through epitaxial growth, forming first region 17b by implanting ions into first portion 12c, forming second portion 12a of drift region 12 on first portion 12c and first region 17b through epitaxial growth, forming base region 13 on second portion 12a through epitaxial growth, forming source region 14 by implanting ions into base region 13, forming second trench T2 having second side surface S2 in contact with source region 14 and base region 13 and second bottom portion B2 in contact with base region 13, forming third portion 46 having the p-type and being in contact with second portion 12a while third portion 46 is spaced apart from first region 17b, by implanting ions into second bottom portion B2 of second trench T2, forming third trench T3 having third side surface S3 continuous to second bottom portion B2 of second trench T2 and being in contact with third portion 46 and third bottom portion B3 continuous to third side surface S3, and forming fourth portion 18f having the p-type and connecting third portion 46 and first region 17b to each other by implanting ions into third bottom portion B3 of third trench T3. Since source electrode 16 is thus formed in further proximity to first region 17b, a resistance between source electrode 16 and first region 17b can further be lowered. Since first region 17b can consequently be fixed in potential to source electrode 16 in a more stable manner, MOSFET 1 faster in response can be obtained.

Though the n-type is defined as the first conductivity type and the p-type is defined as the second conductivity type in each embodiment, the p-type may be defined as the first conductivity type and the n-type may be defined as the second conductivity type. Though description is given by way of example of a MOSFET as the silicon carbide semiconductor device, the silicon carbide semiconductor device may be an insulated gate bipolar transistor (IGBT). When the silicon carbide semiconductor device is an IGBT, first electrode 16 may be an emitter electrode and second electrode 20 may be a collector electrode. Though first side surface S1 of first trench T1 is substantially perpendicular to first main surface 10a of silicon carbide substrate 10, first side surface S1 of first trench T1 may be inclined with respect to first main surface 10a.

EXAMPLE 1

A result of calculation by simulation of a characteristic on-resistance and a breakdown voltage of a MOSFET in an example in which distance a in the MOSFET (see FIG. 16) according to the second embodiment (a distance between base region 13 and seventh region 17c in the direction perpendicular to second main surface 10b) is varied will be described. A characteristic on-resistance and a breakdown voltage of the MOSFET were calculated with a value for distance a being varied from 0.3 µm to 2.5 µm. Distance b (a distance between the point of contact between first side surface S1 and first bottom portion B1 of first trench T1 and side surface 17c2 of seventh region 17c in the direction in parallel to second main surface 10b) was set to 0.2 µm. Distance c (a distance between side surface 17c2 of seventh region 17c and side surface 17a2 of third region 18b in the direction in parallel to second main surface 10b) was set to 0.7 µm. A concentration of an impurity in third drift region 12c was set to $8 \times 10^{15}$ cm$^{-3}$. A concentration of an impurity in second drift region 12b was set to $4.8 \times 10^{16}$ cm$^{-3}$. A concentration of an impurity in first drift region 12a was set to $4 \times 10^{16}$ cm$^{-3}$. A concentration of an impurity in each of seventh region 17c, third region 18b, and first region 17b was set to $2 \times 10^{18}$ cm$^{-3}$. A concentration of an impurity in base region 13 was set to $5 \times 10^{15}$ cm$^{-3}$.

Figure 24:
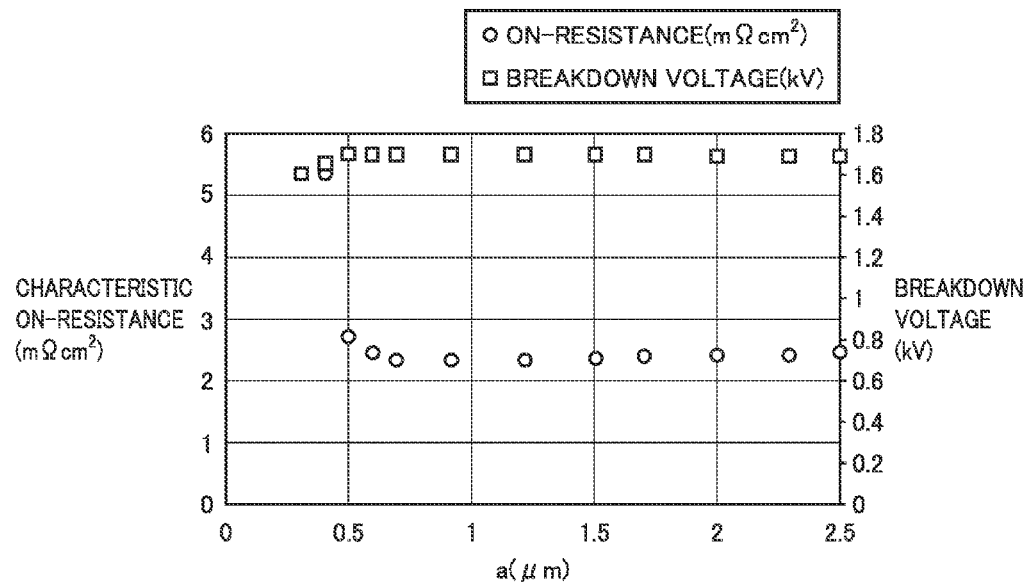
FIG. 24 shows simulation data showing relation between a distance a and a characteristic on-resistance and relation between distance a and a breakdown voltage.

Relation between distance a and a characteristic on-resistance and relation between distance a and a breakdown voltage will be described with reference to FIG. 24. In the figure, the abscissa represents distance a (µm), the left ordinate represents a characteristic on-resistance (mΩcm$^2$) of the MOSFET, and the right ordinate represents a breakdown voltage (kV) of the MOSFET. In the figure, a white circle represents a value for an on-resistance and a white square represents a value for a breakdown voltage.

Regarding the characteristic on-resistance, in a range in which distance a is not smaller than 0.7 µm and not greater than 2.5 µm, a characteristic on-resistance is substantially constant. When distance a is smaller than 0.7 µm, however, a characteristic on-resistance gradually increases, and when distance a is smaller than 0.5 µm, a characteristic on-resistance abruptly increases. When distance a is 0.3 µm, a characteristic on-resistance exceeds 6 mΩcm$^2$ and is not shown in FIG. 18. Regarding the breakdown voltage, in a range in which distance a is not smaller than 0.5 µm and not greater than 2.5 µm, a breakdown voltage is substantially constant. When distance a is smaller than 0.5 µm, however, an on-resistance increases. When a concentration of an impurity in first drift region 12a and second drift region 12b is increased by one order from the condition in the plot in FIG. 24, the lower limit of distance a is approximately 0.2 µm. It was found from the results above that a range of distance a in which a high breakdown voltage and a low characteristic on-resistance can both be achieved is not smaller than 0.2 µm and not greater than 2 µm and preferably not smaller than 0.6 µm and not greater than 1.5 µm.

EXAMPLE 2

A result of calculation by simulation of maximum electric field of a gate oxide film (gate insulating film 15) and a breakdown voltage of a MOSFET when distance b in the MOSFET (see FIG. 16) according to the second embodiment is varied will be described. Maximum electric field of the gate oxide film and a breakdown voltage of the MOSFET were calculated with a value for distance b being varied from −0.1 µm to 0.5 µm. A value for distance b being 0 means that side surface 17c2 of seventh region 17c and first side surface S1 of first trench T1 are located on the same line. A negative value for distance b means that side surface 17c2 of seventh region 17c retracts relative to first side surface S1 of first trench T1 with respect to first region 17b. A positive value for distance b means that side surface 17c2 of seventh region 17c protrudes toward first region 17b relative to first side surface S1 of first trench T1. Distance a was set to 0.6 μm. Distance c was set to 0.7 μm. A concentration of an impurity in third drift region 12c was set to $8\times10^{15}$ cm$^{-3}$. A concentration of an impurity in second drift region 12b was set to $4.8\times10^{16}$ cm$^{-3}$. A concentration of an impurity in first drift region 12a was set to $4\times10^{16}$ cm$^{-3}$. A concentration of an impurity in each of seventh region 17c, third region 18b, and first region 17b was set to $2\times10^{18}$ cm$^{-3}$. A concentration of an impurity in base region 13 was set to $5\times10^{15}$ cm$^{-3}$.

Figure 25:
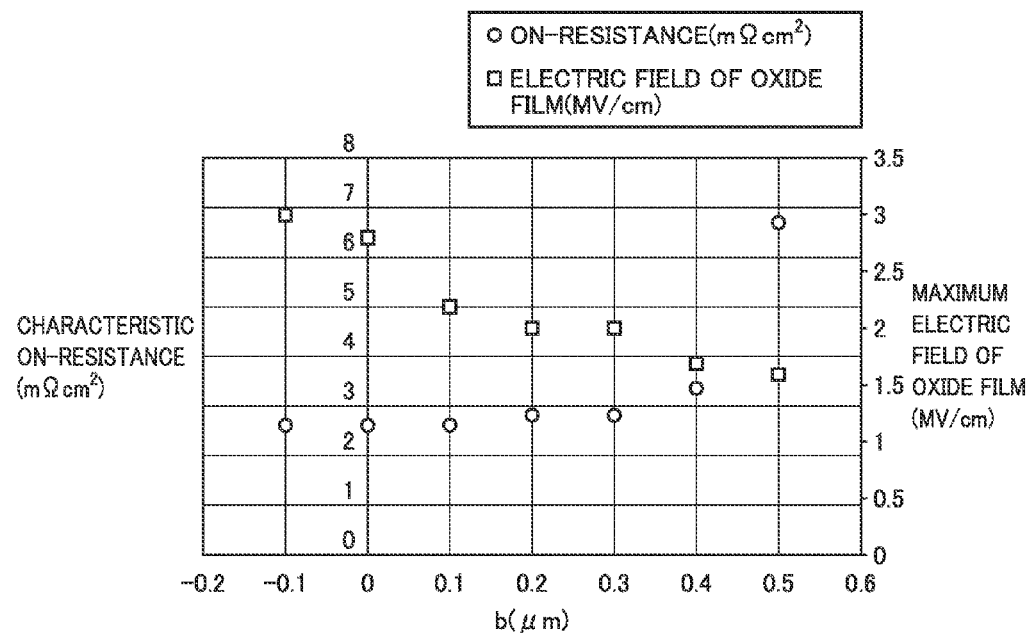
FIG. 25 shows simulation data showing relation between a distance b and a characteristic on-resistance and relation between distance a and a breakdown voltage.

Relation between distance b and maximum electric field of the gate oxide film and relation between distance b and a breakdown voltage will be described with reference to FIG. 25. In the figure, the abscissa represents distance b (μm), the left ordinate represents a characteristic on-resistance (mΩcm$^2$) of the MOSFET, and the right ordinate represents maximum electric field (MV/cm) of the gate oxide film. In the figure, a white circle represents a value for an on-resistance and a white square represents a value for maximum electric field of the gate oxide film.

Regarding the characteristic on-resistance, in a range in which distance b is not smaller than −0.1 μm and not greater than 0.4 μm, a characteristic on-resistance is substantially constant. When distance b is not smaller than 0.5 μm, a characteristic on-resistance gradually increases. Regarding maximum electric field of the gate oxide film, in a range in which distance b is not smaller than 0.1 μm and not greater than 0.5 μm, intensity of maximum electric field sufficiently lower than maximum electric field of 3 MV/cm at which reliability of the oxide film can be maintained can be maintained. When distance a is smaller than 0.1 μm, however, intensity of maximum electric field of the gate oxide film increases. It was found from the results above that a range of distance b in which a low characteristic on-resistance can be achieved while intensity of maximum electric field of the gate oxide film is maintained at at most intensity of maximum electric field (3 MV/cm) at which reliability can be maintained was not smaller than 0.1 μm and not greater than 0.5 μm and preferably not smaller than 0.2 μm and not greater than 0.4 μm.

EXAMPLE 3

A result of calculation by simulation of a characteristic on-resistance and a breakdown voltage of a MOSFET in an example in which distance c in the MOSFET (see FIG. 16) according to the second embodiment is varied will be described. A characteristic on-resistance and a breakdown voltage of the MOSFET were calculated with a value for distance c being varied from 0.1 μm to 1.9 μm. Distance a was set to 0.6 μm. Distance b was set to 0.2 μm. Distance d was set to 1.5 μm. A concentration of an impurity in third drift region 12c was set to $8\times10^{15}$ cm$^{-3}$. A concentration of an impurity in second drift region 12b was set to $4.8\times10^{16}$ cm$^{-3}$. A concentration of an impurity in first drift region 12a was set to $4\times10^{16}$ cm$^{-3}$. A concentration of an impurity in each of seventh region 17c, third region 18b, and first region 17b was set to $2\times10^{18}$ cm$^{-3}$. A concentration of an impurity in base region 13 was set to $5\times10^{15}$ cm$^{-3}$.

Figure 26:
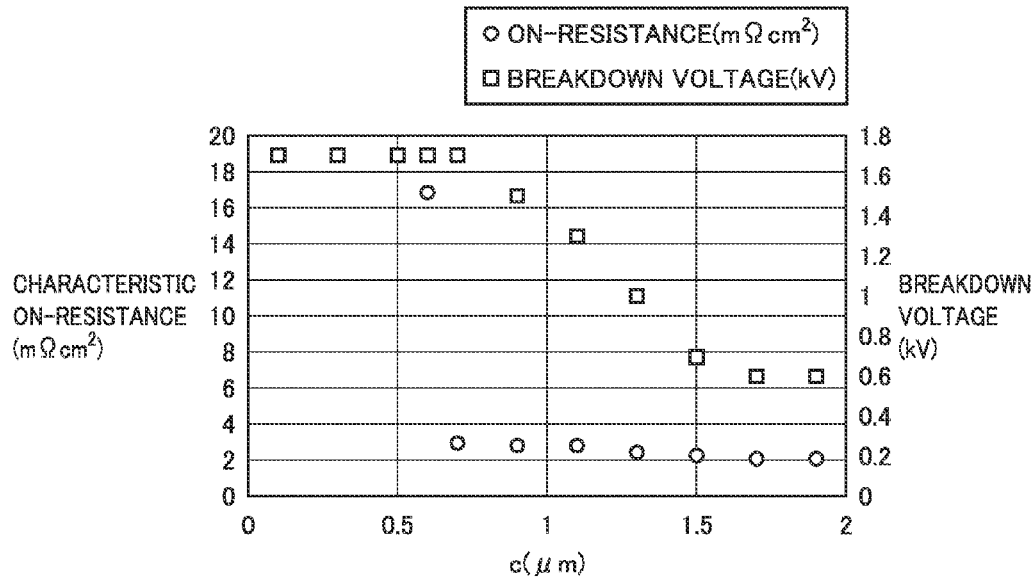
FIG. 26 shows simulation data showing relation between a distance c and a characteristic on-resistance and relation between distance a and a breakdown voltage.

Relation between distance c and a characteristic on-resistance and relation between distance c and a breakdown voltage will be described with reference to FIG. 26. In the figure, the abscissa represents distance c (μm), the left ordinate represents a characteristic on-resistance (mΩcm$^2$) of the MOSFET, and the right ordinate represents a breakdown voltage of the MOSFET. In the figure, a white circle represents a value for an on-resistance and a white square represents a value for a breakdown voltage.

Regarding the characteristic on-resistance, in a range in which distance c is not smaller than 0.7 μm and not greater than 1.9 μm, a characteristic on-resistance is substantially constant. When distance b is 0.6 μm, however, a characteristic on-resistance gradually increases, and when distance b is smaller than 0.6 μm, a value for a characteristic on-resistance abruptly increases to exceed 20 mΩcm$^2$. Regarding the breakdown voltage, in a range in which distance c is not smaller than 0.1 μm and not greater than 0.7 μm, a substantially constant high breakdown voltage can be maintained. When distance c exceeds 0.7 μm, a breakdown voltage removably lowers, and when distance c is in a range not smaller than 1.7 μm and not greater than 1.9 μm, the breakdown voltage maintains a substantially constant value. It was found from the results above that a range of distance c in which a high breakdown voltage and a low characteristic on-resistance can both be achieved is not smaller than 0.6 μm and not greater than 1.5 μm and preferably not smaller than 0.7 μm and not greater than 1.0 μm.

EXAMPLE 4

A result of calculation by simulation of a characteristic on-resistance and a breakdown voltage of a MOSFET in an example in which distance d in the MOSFET (see FIG. 16) according to the second embodiment is varied will be described. In a first example (see FIG. 27), a characteristic on-resistance and a breakdown voltage of the MOSFET were calculated with distance c being set to 0.8 μm and a value for distance d being varied from 0.7 μm to 1.5 μm. In a second example (see FIG. 28), distance c was set to 0.9 μm and a value for distance d was varied from 0.9 μm to 1.5 μm. In both examples, distance a was set to 0.6 μm. Distance b was set to 0.2 μm. A concentration of an impurity in third drift region 12c was set to $8\times10^{15}$ cm$^{-3}$. A concentration of an impurity in second drift region 12b was set to $4.8\times10^{16}$ cm$^{-3}$. A concentration of an impurity in first drift region 12a was set to $4\times10^{16}$ cm$^{-3}$. A concentration of an impurity in each of seventh region 17c, third region 18b, and first region 17b was set to $2\times10^{18}$ cm$^{-3}$. A concentration of an impurity in base region 13 was set to $5\times10^{15}$ cm$^{-3}$.

Relation between distance d and a characteristic on-resistance and relation between distance d and a breakdown voltage will be described with reference to FIGS. 27 and 28. In the figures, the abscissa represents distance d (μm), the left ordinate represents a characteristic on-resistance (mΩcm$^2$) of the MOSFET, and the right ordinate represents a breakdown voltage of the MOSFET. In the figures, a white circle represents a value for an on-resistance and a white square represents a value for a breakdown voltage.

Figure 27:
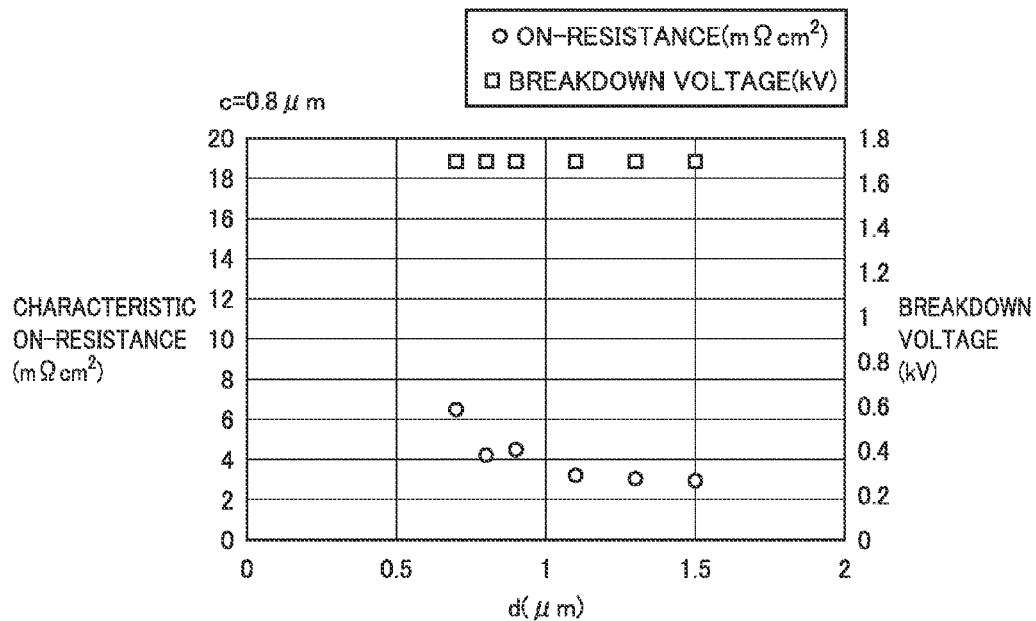
FIG. 27 shows simulation data showing relation between a distance d and a characteristic on-resistance and relation between distance a and a breakdown voltage when distance c is set to 0.8 μm.
Figure 28:
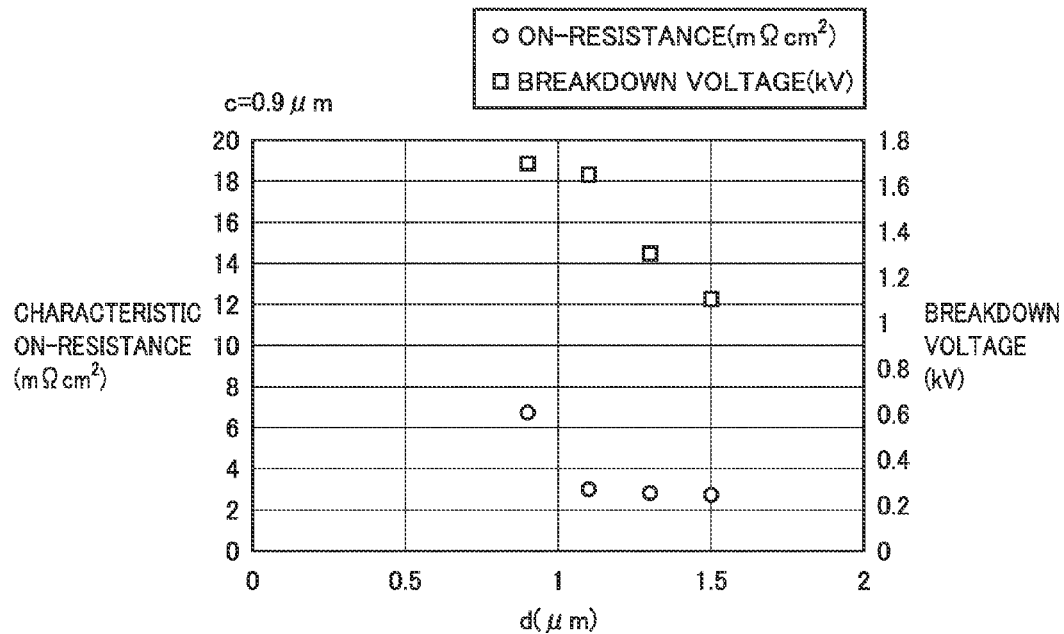
FIG. 28 shows simulation data showing relation between distance d and a characteristic on-resistance and relation between distance a and a breakdown voltage when distance c is set to 0.9 μm.

Referring to FIG. 27, in a range in which distance d is not smaller than 0.7 μm and not greater than 1.5 μm, a low characteristic on-resistance and a high breakdown voltage can be maintained. Referring to FIG. 28, in a range in which distance d is not greater than 1.1 μm, a high breakdown voltage can be maintained while a low characteristic on-resistance is maintained. It was found from the results above that a range of distance d in which a high breakdown voltage and a low characteristic on-resistance can both be achieved is not smaller than 0.5 μm and not greater than 1.5 preferably not smaller than 0.7 μm and not greater than 1.5 and further preferably not smaller than 0.7 μm and not greater than 1.0 μm.

EXAMPLE 5

A result of calculation by simulation of a characteristic on-resistance of a MOSFET in an example in which a concentration of an impurity in second impurity region 13 in the MOSFET (see FIG. 16) according to the second embodiment is varied will be described. A characteristic on-resistance of the MOSFET was calculated with a value for a concentration of an impurity in second impurity region 13 being varied from $3 \times 10^{15}$ cm$^{-3}$ to $5 \times 10^{16}$ cm$^{-3}$. Distance c was set to 0.7 μm.

Figure 29:
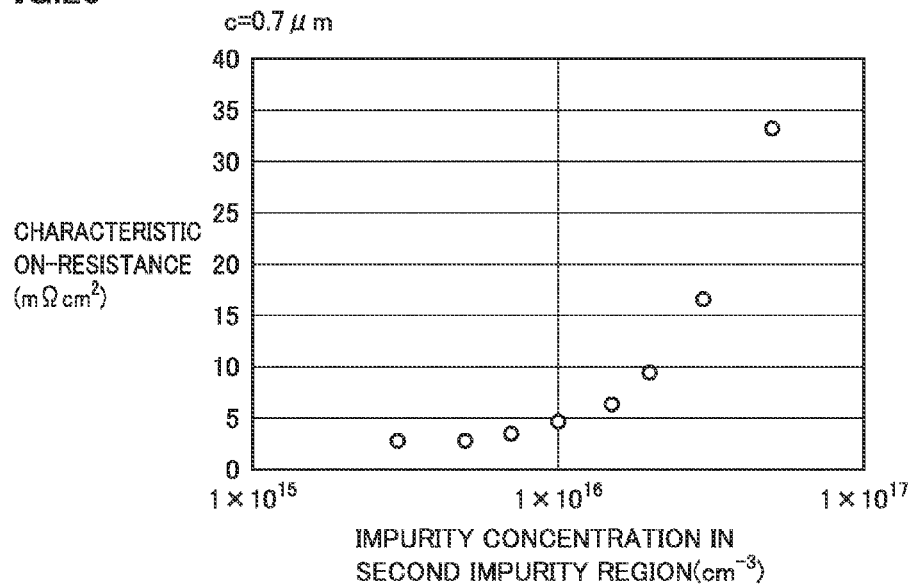
FIG. 29 shows simulation data showing relation between an impurity concentration in a second impurity region and a characteristic on-resistance when distance c is set to 0.7 μm.

Relation between a concentration of an impurity in the second impurity region and a characteristic on-resistance will be described with reference to FIG. 29. In the figure, the abscissa represents a concentration of an impurity in the second impurity region (cm$^{-3}$) and the left ordinate represents a characteristic on-resistance (mΩcm$^2$) of the MOSFET.

As a concentration of an impurity in second impurity region 13 forming the channel is lower, mobility is higher. According to the structure of the MOSFET shown in the second embodiment, even when a concentration of an impurity in the second impurity region is equal to or lower than $1 \times 10^{17}$ cm$^{-3}$, a high breakdown voltage can be maintained without occurrence of punch through in the second impurity region. Even when a concentration of an impurity in the second impurity region is lowered to $3 \times 10^{15}$ cm$^{-3}$, a breakdown voltage can be maintained. An effect of improvement in mobility, however, is not obtained even when a concentration of an impurity is lower than $3 \times 10^{15}$ cm$^{-3}$, whereas a short channel effect takes place. Therefore, a concentration of an impurity in second impurity region 13 is desirably not lower than $3 \times 10^{15}$ cm$^{-3}$ and not higher than $3 \times 10^{16}$ cm$^{-3}$. A concentration of an impurity in each of seventh region 17c, third region 18b, and first region 17b is preferably not lower than $1 \times 10^{18}$ cm$^{-3}$ from a point of view of maintaining a high breakdown voltage and preferably not higher than $2 \times 10^{19}$ cm$^{-3}$ from a point of view of suppression of a leakage current due to a defect.

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST 1 silicon carbide semiconductor device (MOSFET); 5 silicon carbide epitaxial layer; 10 silicon carbide substrate; 10a first main surface; 10b second main surface; 11 silicon carbide single-crystal substrate; 12 first impurity region (drift region); 12a first drift region (second portion); 12b second drift region; 12c third drift region (first portion); 13 second impurity region (base region); 14 third impurity region (source region); 15 gate insulating film; 16 first electrode (source electrode); 17 fourth impurity region; 17a2, 17b2, 17c2, 18b2 side surface; 17a1, 17c1, 18b1 surface; 17b first region; 17c seventh region; 17d connection portion (eighth region); 18 second region; 18a fourth region; 18b third region; 18c fifth region; 18d ninth region; 18e tenth region; 18f sixth region (fourth portion); 19 source interconnection; 20 second electrode (drain electrode); 21 interlayer insulating film; 22 buffer layer; 24 protecting film; 27 gate electrode; 41 ion implantation mask; 42, 43 through film; 44, 45 mask; 46 third portion; B1 first bottom portion; B2 second bottom portion; B3 third bottom portion; CH channel region; S1 first side surface; S2 second side surface; S3 third side surface; T1 first trench; T2 second trench; T3 third trench; and a, b, c, d distance.

The invention claimed is:
1. A silicon carbide semiconductor device comprising:
a silicon carbide substrate having a first main surface and a second main surface opposite to the first main surface,
the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region,
in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface,
the fourth impurity region having a first region arranged between the second main surface and the second impurity region and a second region connecting the second bottom portion of the second trench and the first region to each other;
a gate insulating film in contact with the first impurity region, the second impurity region, and the third impurity region at the first side surface of the first trench;
a gate electrode provided on the gate insulating film;
a first electrode electrically connected to the third impurity region on a side of the first main surface and being in contact with the second region at the second bottom portion of the second trench; and
a second electrode electrically connected to the first impurity region on a side of the second main surface,
the fourth impurity region being electrically connected to the first electrode,
the second region has a third region in contact with the first impurity region and the first region and a fourth region which passes through the second impurity region and connects the second bottom portion of the second trench and the third region to each other, and
a side surface of the third region is provided to protrude toward the first side surface of the first trench relative to a side surface of the first region.
2. A silicon carbide semiconductor device comprising:
a silicon carbide substrate having a first main surface and a second main surface opposite to the first main surface,
the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface, the fourth impurity region having a first region arranged between the second main surface and the second impurity region and a second region connecting the second bottom portion of the second trench and the first region to each other;

a gate insulating film in contact with the first impurity region, the second impurity region, and the third impurity region at the first side surface of the first trench;

a gate electrode provided on the gate insulating film;

a first electrode electrically connected to the third impurity region on a side of the first main surface and being in contact with the second region at the second bottom portion of the second trench; and a second electrode electrically connected to the first impurity region on a side of the second main surface, the fourth impurity region being electrically connected to the first electrode, the second region has a third region in contact with the first impurity region and the first region and a fourth region which passes through the second impurity region and connects the second bottom portion of the second trench and the third region to each other, and a side surface of the third region is provided to retract toward a side opposite to the first side surface of the first trench relative to a side surface of the first region.

3. A silicon carbide semiconductor device comprising:

a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface, the fourth impurity region having a first region arranged between the second main surface and the second impurity region and a second region connecting the second bottom portion of the second trench and the first region to each other;

a gate insulating film in contact with the first impurity region, the second impurity region, and the third impurity region at the first side surface of the first trench;

a gate electrode provided on the gate insulating film;

a first electrode electrically connected to the third impurity region on a side of the first main surface and being in contact with the second region at the second bottom portion of the second trench; and a second electrode electrically connected to the first impurity region on a side of the second main surface, the fourth impurity region being electrically connected to the first electrode, and in the second bottom portion of the second trench, a third trench having a third side surface continuous to the second bottom portion and a third bottom portion continuous to the third side surface is provided, and the second region has a fifth region in contact with the third side surface of the third trench and the second bottom portion of the second trench and a sixth region being in contact with the first region and electrically connected to the fifth region.

4. A silicon carbide semiconductor device comprising:

a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface, the fourth impurity region having a first region arranged between the second main surface and the second impurity region and a second region connecting the second bottom portion of the second trench and the first region to each other;

a gate insulating film in contact with the first impurity region, the second impurity region, and the third impurity region at the first side surface of the first trench;

a gate electrode provided on the gate insulating film;

a first electrode electrically connected to the third impurity region on a side of the first main surface and being in contact with the second region at the second bottom portion of the second trench; and a second electrode electrically connected to the first impurity region on a side of the second main surface, the fourth impurity region being electrically connected to the first electrode, and the fourth impurity region further has a seventh region which faces the first bottom portion of the first trench and is electrically connected to the first electrode.

5. The silicon carbide semiconductor device according to claim 4, wherein the fourth impurity region further includes an eighth region which connects a part of one side in a direction of a major axis of the first region and a part of one side in a direction of a major axis of the seventh region to each other when viewed in a direction perpendicular to the second main surface, and the second bottom portion of the second trench is located on a region where the first region and the eighth region intersect with each other.

6. The silicon carbide semiconductor device according to claim 1, wherein a width of the first bottom portion in a direction of a major axis of the first bottom portion of the first trench is longer than a width of the second bottom portion of the second trench in the direction of the major axis of the first bottom portion when viewed in the direction perpendicular to the second main surface.

7. A method for manufacturing a silicon carbide semiconductor device, comprising:

preparing a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface, the fourth impurity region having a first region arranged between the second main surface and the second impurity region and a second region connecting the second bottom portion of the second trench and the first region to each other;

forming a gate insulating film in contact with the first impurity region, the second impurity region, and the third impurity region at the first side surface of the first trench;

forming a gate electrode on the gate insulating film;

forming a first electrode electrically connected to the third impurity region on a side of the first main surface and being in contact with the second region at the second bottom portion of the second trench; and forming a second electrode electrically connected to the first impurity region on a side of the second main surface, the fourth impurity region being electrically connected to the first electrode, the second region has a third region in contact with the first impurity region and the first region and a fourth region which passes through the second impurity region and connects the second bottom portion of the second trench and the third region to each other, and forming the silicon carbide substrate includes forming a first portion of the first impurity region through epitaxial growth, forming the first region by implanting ions into the first portion of the first impurity region, forming a second portion of the first impurity region on the first portion of the first impurity region and the first region through epitaxial growth, forming the third region by implanting ions into the second portion of the first impurity region, forming the second impurity region on the third region and the second portion through epitaxial growth, forming the third impurity region by implanting ions into the second impurity region, forming the second trench having the second side surface in contact with the third impurity region and the second impurity region and the second bottom portion in contact with the second impurity region, and forming the fourth region by implanting ions into the second bottom portion of the second trench.

8. The method for manufacturing a silicon carbide semiconductor device according to claim 7, wherein a side surface of the third region is provided to protrude toward the first side surface of the first trench relative to a side surface of the first region.

9. The method for manufacturing a silicon carbide semiconductor device according to claim 7, wherein a side surface of the third region is provided to retract toward a side opposite to the first side surface of the first trench relative to a side surface of the first region.

10. A method for manufacturing a silicon carbide semiconductor device, comprising:

preparing a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface, the fourth impurity region having a first region arranged between the second main surface and the second impurity region and a second region connecting the second bottom portion of the second trench and the first region to each other;

forming a gate insulating film in contact with the first impurity region, the second impurity region, and the third impurity region at the first side surface of the first trench;

forming a gate electrode on the gate insulating film;

forming a first electrode electrically connected to the third impurity region on a side of the first main surface and being in contact with the second region at the second bottom portion of the second trench; and forming a second electrode electrically connected to the first impurity region on a side of the second main surface, the fourth impurity region being electrically connected to the first electrode, and forming the silicon carbide substrate includes forming a first portion of the first impurity region through epitaxial growth, forming the first region by implanting ions into the first portion, forming a second portion of the first impurity region on the first portion and the first region through epitaxial growth, forming the second impurity region on the second portion through epitaxial growth, forming the third impurity region by implanting ions into the second impurity region, forming the second trench having the second side surface in contact with the third impurity region and the second impurity region and the second bottom portion in contact with the second impurity region, forming a third portion having the second conductivity type and being in contact with the second portion while the third portion is spaced apart from the first region, by implanting ions into the second bottom portion of the second trench, forming a third trench having a third side surface continuous to the second bottom portion of the second trench and being in contact with the third portion and a third bottom portion continuous to the third side surface, and forming a fourth portion having the second conductivity type and connecting the third portion and the first region to each other by implanting ions into the third bottom portion of the third trench.

11. The method for manufacturing a silicon carbide semiconductor device according to claim 7, wherein the fourth impurity region further has a seventh region which faces the first bottom portion of the first trench and is electrically connected to the first electrode.

12. A method for manufacturing a silicon carbide semiconductor device comprising:

preparing a silicon carbide substrate having a first main surface and a second main surface opposite to the first main surface, the silicon carbide substrate including a first impurity region having a first conductivity type, a second impurity region which is in contact with the first impurity region and has a second conductivity type different from the first conductivity type, a third impurity region which has the first conductivity type and is spaced apart from the first impurity region by the second impurity region, and a fourth impurity region which has the second conductivity type and is higher in impurity concentration than the second impurity region, in the first main surface of the silicon carbide substrate, a first trench having a first side surface and a first bottom portion being formed, the first side surface continuous to the first main surface and being in contact with the third impurity region, the second impurity region, and the first impurity region, the first bottom portion continuous to the first side surface, and in the first main surface, a second trench having a second side surface and a second bottom portion being formed, the second side surface continuous to the first main surface and being in contact with the third impurity region and the second impurity region, the second bottom portion continuous to the second side surface, the fourth impurity region having a first region arranged between the second main surface and the second impurity region and a second region connecting the second bottom portion of the second trench and the first region to each other;

forming a gate insulating film in contact with the first impurity region, the second impurity region, and the third impurity region at the first side surface of the first trench;

forming a gate electrode on the gate insulating film;

forming a first electrode electrically connected to the third impurity region on a side of the first main surface and being in contact with the second region at the second bottom portion of the second trench; and forming a second electrode electrically connected to the first impurity region on a side of the second main surface, the fourth impurity region being electrically connected to the first electrode, the second region has a third region in contact with the first impurity region and the first region and a fourth region which passes through the second impurity region and connects the second bottom portion of the second trench and the third region to each other, and forming the silicon carbide substrate includes forming a first portion of the first impurity region through epitaxial growth, forming the first region, a second portion of the first impurity region located on the first portion of the first impurity region and the first region, and the third region by implanting ions into the first portion of the first impurity region, forming the second impurity region on the third region and the second portion through epitaxial growth, forming the third impurity region by implanting ions into the second impurity region, forming the second trench having the second side surface in contact with the third impurity region and the second impurity region and the second bottom portion in contact with the second impurity region, and forming the fourth region by implanting ions into the second bottom portion of the second trench.

\* \* \* \* \*